(12) United States Patent
Eldridge et al.

(10) Patent No.: US 6,953,706 B2
(45) Date of Patent: Oct. 11, 2005

(54) METHOD OF PROVIDING A SEMICONDUCTOR PACKAGE HAVING AN INTERNAL HEAT-ACTIVATED HYDROGEN SOURCE

(75) Inventors: Jerome M. Eldridge, Los Gatos, CA (US); Paul A. Farrar, South Bulington, VT (US)

(73) Assignee: Micron Technology, Inc., Boise, ID (US)

( * ) Notice: Subject to any disclaimer, the term of this patent is extended or adjusted under 35 U.S.C. 154(b) by 53 days.

(21) Appl. No.: 10/438,848

(22) Filed: May 16, 2003

(65) Prior Publication Data

US 2003/0209702 A1 Nov. 13, 2003

Related U.S. Application Data

(62) Division of application No. 09/929,350, filed on Aug. 15, 2001, now Pat. No. 6,888,232.

(51) Int. Cl.[7] .......................... H01L 21/44; H01L 21/48
(52) U.S. Cl. ....................... 438/106; 438/115; 438/121; 438/125; 257/682; 257/721
(58) Field of Search ............................. 438/106, 115, 438/121, 125, FOR 376, FOR 382; 257/704, 721, 715, 682

(56) References Cited

U.S. PATENT DOCUMENTS 3,766,634 A * 10/1973 Babcock et al. ............ 228/188
5,543,364 A * 8/1996 Stupian et al. .............. 438/115
5,593,926 A 1/1997 Fujihira
5,891,797 A 4/1999 Farrar
2001/0034117 A1 * 10/2001 Eldridge et al. ............ 438/619

OTHER PUBLICATIONS

"The New Low–K Candidate: It's a Gas," *Semiconductor International* (Mar. 1999), p. 38.
"Thermal Conduction Module: A High–Performance Multilayer Ceramic Package," A.J. Blodgett and D.R. Barbour, *IBM Journal of Research and Development*, vol. 26, No. 1(Jan. 1982), pp. 30–36.
"Future Packaging Trends: CSP vs. Flip Chip," E. Jan Vardaman, 11th European Microelectronics Conference—1997, pp. 299.

* cited by examiner

Primary Examiner—Tom Thomas
Assistant Examiner—Matthew E. Warren
(74) Attorney, Agent, or Firm—Dickstein Shapiro Morin & Oshinsky LLP

(57) ABSTRACT

Manufacturable processes and the resultant structures utilize metal hydride as an internal source of hydrogen to enhance heat removal within semiconductor packages that employ low dielectric constant materials. The use of a metal hydride heated by internal or external sources facilitates pressurizing hydrogen gas or hydrogen-helium gas mixtures within a hermetically-sealed package. The configuration of the metal hydride can include, where needed to generate the pressure required in larger packages, a relatively large area of metal hydride material on at least one or a plurality of hydrogen generation-dedicated chips. Alternatively, the configuration can include at least one or a plurality of relatively small "islands" of metal hydride material on each of at least one or a plurality of integrated circuit-bearing chips.

67 Claims, 26 Drawing Sheets

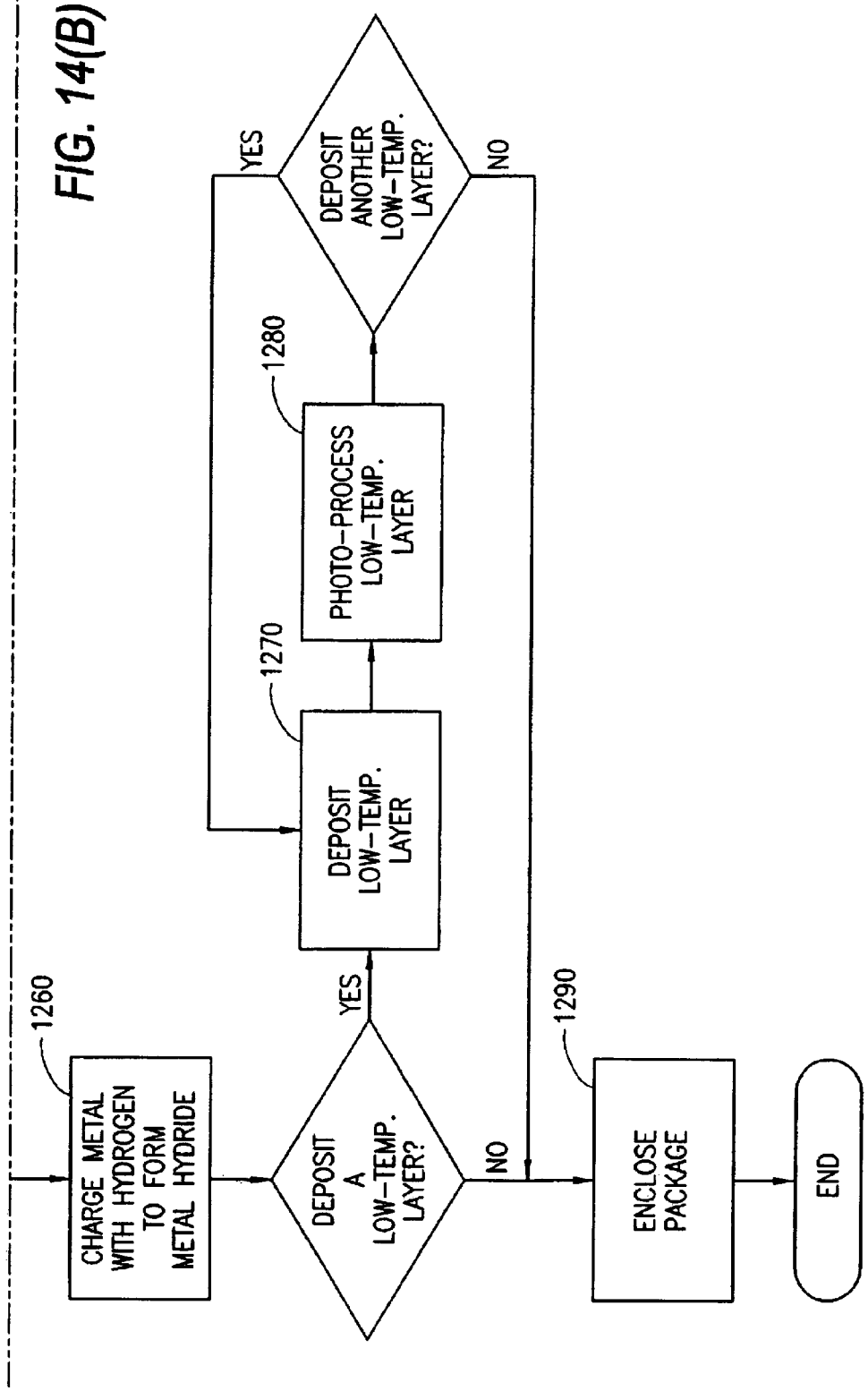

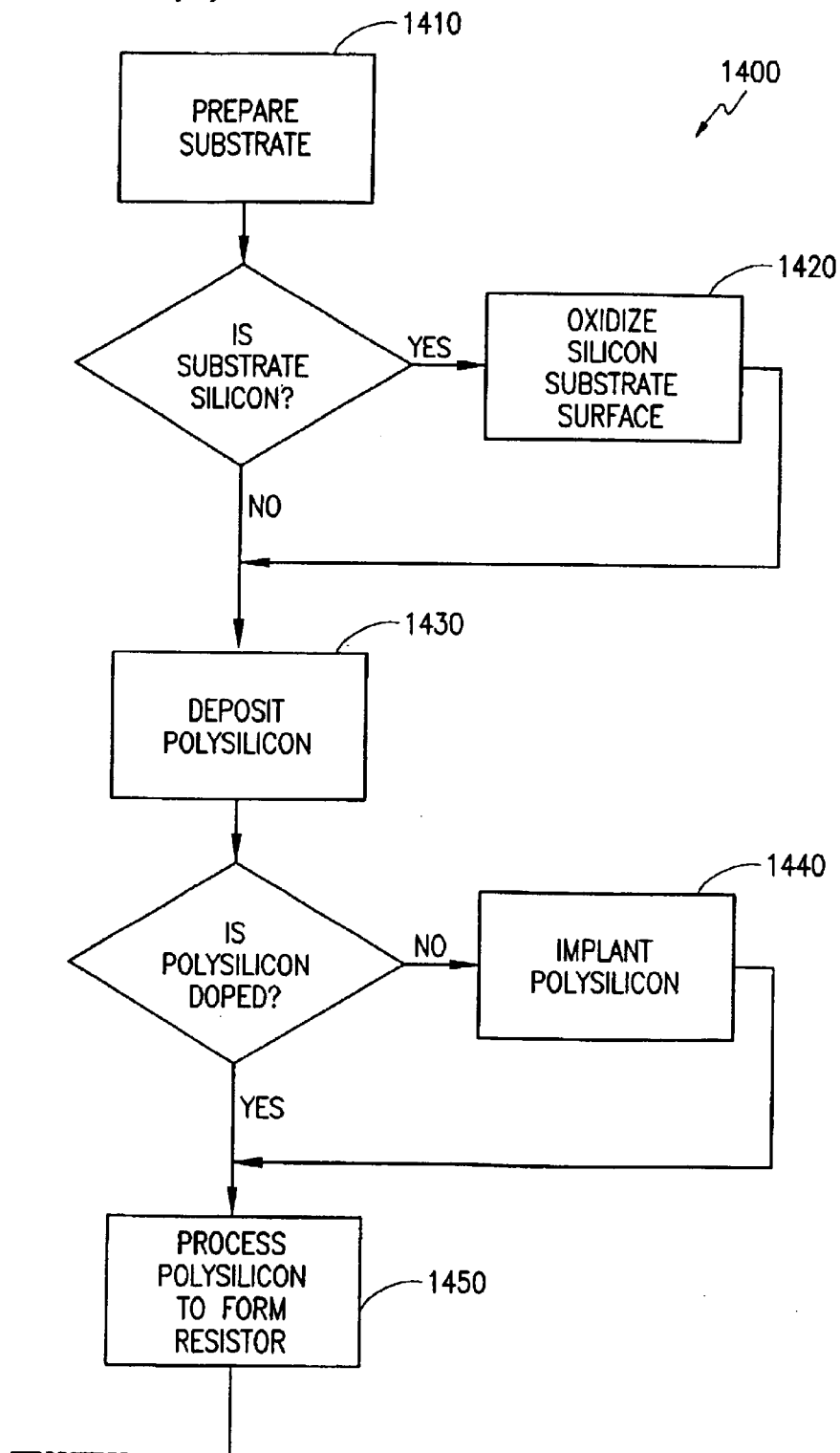

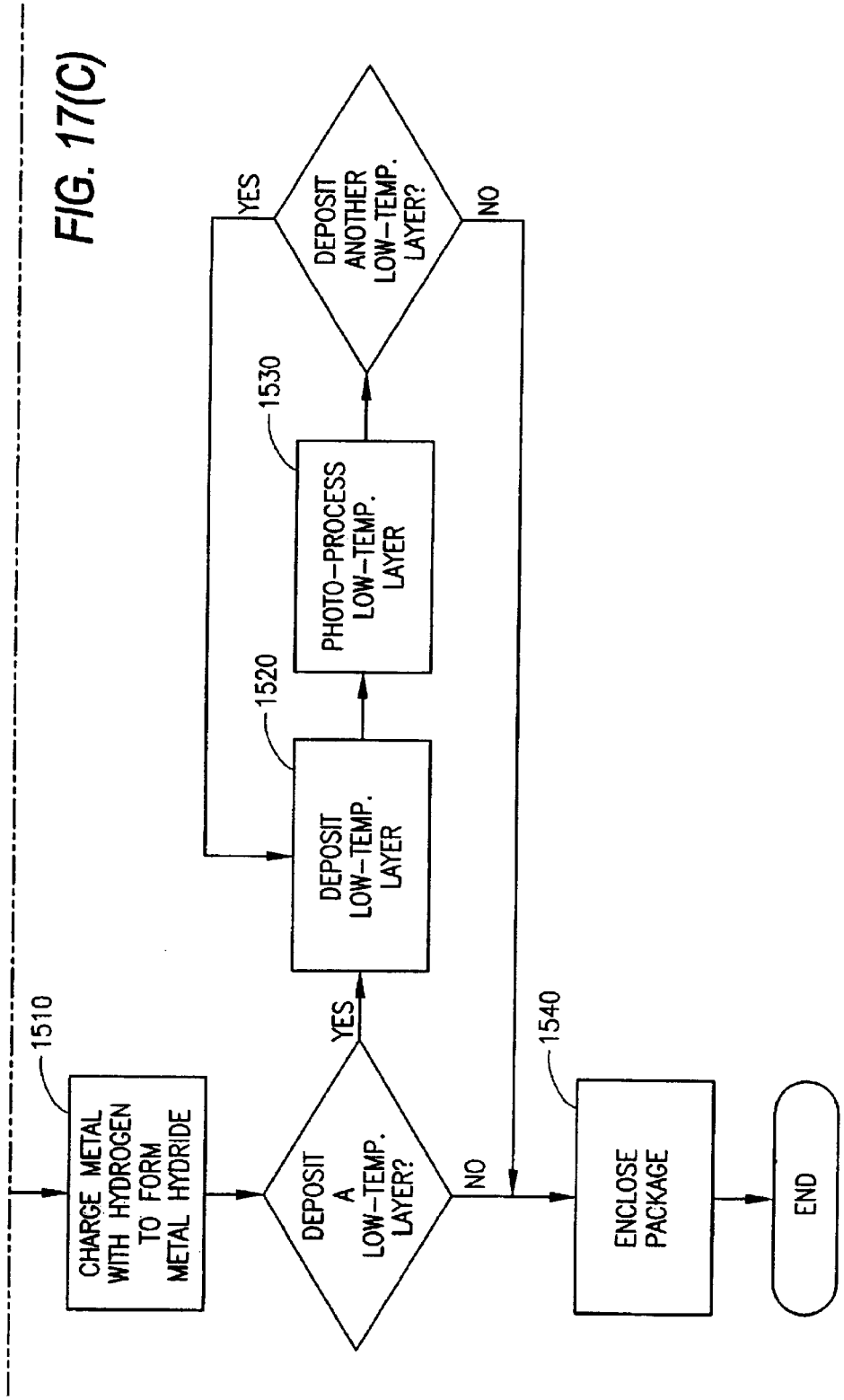

METHOD OF PROVIDING A SEMICONDUCTOR PACKAGE HAVING AN INTERNAL HEAT-ACTIVATED HYDROGEN SOURCE

CROSS-REFERENCE TO RELATED APPLICATIONS

This application is a divisional application of U.S. patent application Ser. No. 09/929,350, filed Aug. 15, 2001, now U.S. Pat. No. 6,888,232, the entirety of which is incorporated herein by reference.

BACKGROUND OF THE INVENTION

1. Field of the Invention

This invention relates generally to heat conductive packaging of air-bridge and other low dielectric constant semiconductor chips. The invention relates more specifically to heat conductive packaging that employs an internal source of hydrogen, and methods of providing hydrogen therefor.

2. Description of the Related Art

As the minimum feature size achievable in semiconductor manufacturing continues to decrease, capacitive coupling between adjacent devices becomes a significant impediment to increased performance. Unfortunately, there are only a limited number of potential solutions to this problem. As the minimum feature size decreases, the number of devices potentially achievable in a given area increases with the inverse square of the feature size, while the space between devices decreases linearly. As the areal density of devices is raised, the amount of interconnection metallurgy must also be raised. This raises capacitive interactions between circuits on the chip, which is undesirable. Designers and process engineers, therefore, have been seeking ways to counteract this wiring capacitance problem. While various solutions have been proposed, a problem associated with several of the proposed approaches is that the heat transfer capability of the system is significantly reduced when a low dielectric constant material is employed.

For example, one approach to addressing the capacitive coupling problem has been to substitute lower dielectric constant materials for the $SiO_2$ films (which have a dielectric constant K value of approximately 4) that are used in most VLSI chips. For example, polyimide (K equal to approximately 3.5) has been used in one commercial product where it provided a limited reduction in fringing capacitance.

It has also been proposed to electrically insulate active devices using air-gaps (i.e., "air-bridges," with a value of K equal to 1). Such air-bridges have been limitedly employed for specialized applications. However, air-gap insulators introduce other problems. For example, they do not protect the metallurgical interconnection structures from environmental corrosion. Another major drawback associated with air insulators is that they significantly reduce the heat transfer capability of the system.

Other proposed approaches to addressing the capacitive coupling problem include filling the spaces between metal lines with carbon dioxide. "The New Low-K Candidate: It's a Gas," *Semiconductor International* (March 1999), p. 38. The proposed process sequence involves a damascene process in which trenches are formed in an amorphous carbon layer followed by metal deposition to fill the trenches. After chemical mechanical polishing, a thin insulator is deposited to form a bridge layer over the metal lines. This insulator is permeable to oxygen and by implication to carbon dioxide to some extent. Presumably this process is repeated to form a multilevel metal conductor line structure. Exposure to oxygen at an elevated temperature allows oxygen to permeate into the structure and form volatile oxides of carbon. Clearly most of the gaseous products must diffuse out through the insulator in order to prevent a pressure buildup that could delaminate the insulator. When completed, the structure is free of carbon and filled with the desired $CO_2$ insulating layers having an unspecified pressure. Unfortunately, the $CO_2$ insulator has a thermal conductivity that is only approximately 1.5% of that of $SiO_2$. Accordingly, chips with this insulation alone would be expected to operate at significantly higher temperatures than those made with $SiO_2$. Some heat can still be removed through the package around the base of the silicon chip. Nevertheless, additional cooling is still required.

Even though the aforementioned solutions to the capacitive coupling problem have been proposed, providing for adequate heat removal presents a serious challenge, especially as device size is continually reduced. This evolution requires reducing conductor cross-sections, which increases electrical resistance (per unit length of conductor), thus raising resistive heating. Replacement of the traditional aluminum and aluminum alloy conductors with more conductive copper only partially reduces this mode of heat generation.

In one approach to providing enhanced heat conductivity, helium has been enveloped in the package at very modest pressures (1.6 MPa, or 1.6 atmospheres). "Thermal Conduction Module: A High-Performance Multilayer Ceramic Package," A. J. Blodgett and D. R. Barbour, *IBM Journal of Research and Development*, Vol. 26, No. 1 (January 1982), pp. 30–36. The use of the slightly elevated package pressure is necessary to compensate for helium loss by permeation outward through the packaging during its lifetime.

Therefore, although different approaches have been taken to address the problem of capacitive coupling, many of the approaches suffer from the same resultant problem—a significant reduction in the heat transfer capability of the system. While the use of a helium-filled package has been proposed as a way to lessen the effect of diminished heat transfer, helium loss from permeation will occur over time, thereby lessening the heat transfer capability of the package.

Thus, no single solution to the problem of capacitive coupling has emerged that satisfies all of the technical requirements. More specifically, a need exists for a solution which not only lessens the effect of capacitive coupling, but which does so without adversely impacting the heat transfer capability of the package.

BRIEF SUMMARY OF THE INVENTION

The present invention provides heat conductive packaging of air-bridge and other low dielectric constant semiconductor chips. More specifically, the present invention provides heat conductive packaging that employs an internal source of hydrogen, and a method of providing hydrogen therefor.

The invention, therefore, is directed to manufacturable processes and the resultant structures that utilize a metal hydride as an internal source of hydrogen in order to enhance heat removal within semiconductor packages. The invention employs relatively high pressure hydrogen gas or hydrogen-helium gas mixtures to fill a hermetically-sealed module or envelope surrounding the chip or chips in an electronic package. The use of a metal hydride that can be heated by internal or external means facilitates pressurizing the hydrogen gas or hydrogen-helium gas mixtures within the hermetically-sealed package to pressures of from about 5 MPa to about 50 MPa or higher. Because the thermal conductivities of hydrogen and helium increase approximately linearly with their pressure at values well below their critical points, the use of elevated pressure is particularly beneficial.

Accordingly, in a first embodiment, the present invention relates to a method of providing heat conductive packaging for a semiconductor package. The method comprises first hermetically sealing a semiconductor chip within a package which encloses a first gas at a first pressure and a source of releasable hydrogen. Then, the hermetically sealed package is pressurized from the first pressure to a second pressure by releasing the hydrogen into the first gas, so as to provide a second pressure gas having an increased hydrogen content.

The method of releasing the hydrogen into the first gas comprises heating the source of releasable hydrogen with a source of heat internal to the package, such as, for example, at least one or a plurality of heaters and their associated heater circuitry. In another embodiment, the method of releasing the hydrogen into the first gas comprises heating the metal hydride source of releasable hydrogen with a source of heat external to the package, such as, for example, a laser.

Various configurations of the metal hydride thin films within the chips and/or the package are possible. The configuration of the metal hydride can include, in a first embodiment, where needed to generate the pressure required in larger semiconductor packages, a relatively large area of metal hydride material on at least one or a plurality of hydrogen generation-dedicated chips. In a second embodiment, the configuration of the metal hydride can include at least one or a plurality of relatively small "islands" of metal hydride material on each of at least one or a plurality of integrated circuit-bearing chips.

By virtue of the aforementioned features and other features described herein, the present invention provides heat conductive packaging of air-bridge and other low dielectric constant semiconductor chips, thereby overcoming the deficiencies associated with prior art methods and structures.

BRIEF DESCRIPTION OF THE DRAWINGS

Other features and advantages of the present invention will become more fully apparent from the following detailed description of the preferred embodiments, the appended claims, and the accompanying drawings. As depicted in the attached drawings:

FIGS. 17A–C are a flow diagram of the fabrication sequence corresponding to FIGS. 16A–F.

DETAILED DESCRIPTION OF THE INVENTION

Figure 1:
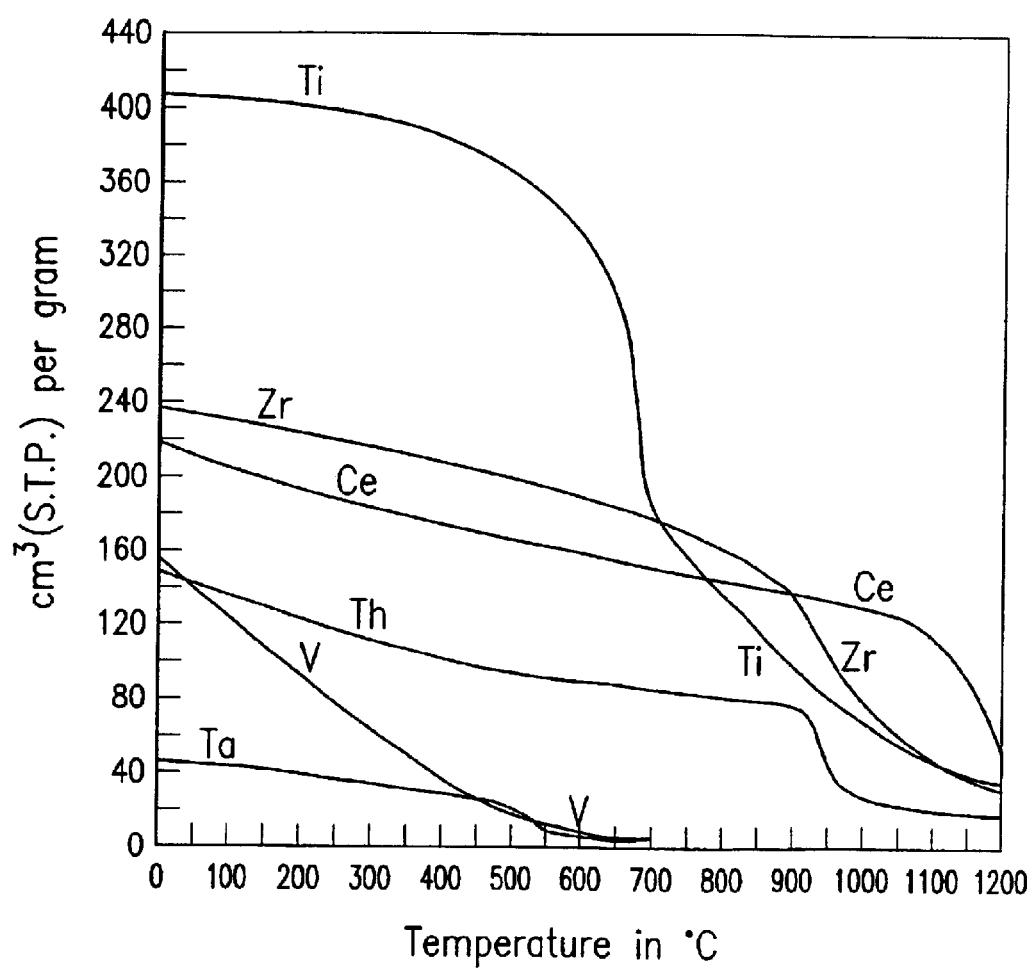
FIG. 1 is a graphical illustration of the ability of various metals to form hydrides with varying hydrogen contents and ranges of temperature stability.

The present invention will be understood from the exemplary embodiments described herein.

In order to fulfill a need for heat conductive packaging of air-bridge and other low dielectric constant semiconductor chips, the present invention is directed to manufacturable processes and the resultant structures that utilize a metal hydride as an internal source of hydrogen in order to enhance heat removal within the semiconductor packages. The invention employs relatively high pressure hydrogen gas or hydrogen-helium gas mixtures to fill a hermetically-sealed module or envelope surrounding the chip or chips in an electronic package. The use of a metal hydride that can be heated by internal or external sources facilitates pressurizing the hydrogen gas or hydrogen-helium gas mixtures within the hermetically-sealed package to pressures of from about 5 MPa to about 50 MPa or higher. Because the thermal conductivities of hydrogen and helium increase approximately linearly with their pressure at values well below their critical points, the use of elevated pressure is particularly beneficial.

Accordingly, in a first embodiment, the present invention relates to a method of providing heat conductive packaging for a semiconductor package. The method comprises hermetically sealing a semiconductor chip within a package which encloses a first gas at a first pressure and a source of releasable hydrogen. Then, the hermetically sealed package is pressurized from the first pressure to a second pressure by releasing the hydrogen into the first gas, so as to provide a second pressure gas having an increased hydrogen content.

The heat conductive packaging structure can be generally described as follows. Before the package is pressurized from the first pressure to the second pressure by releasing the hydrogen into the first gas, the semiconductor package is described herein as having enhanced heat removal capability. The package comprises a hermetically sealed enclosure within which are enclosed a semiconductor chip, a first gas, and a source of releasable hydrogen.

After the package has been pressurized by releasing the hydrogen into the first gas, the semiconductor package is described herein as a package for enhanced heat removal. The package comprises a hermetically sealed enclosure within which are enclosed a semiconductor chip, a source of releasable hydrogen, and a gas at an elevated pressure. The gas at an elevated pressure comprises a first gas component and a second gas component. The second gas component results from the release of the releasable hydrogen, and the first gas component is initially present within the enclosure prior to the release of the releasable hydrogen, with the first gas component initially present at a pressure lower than the elevated pressure.

In a typical embodiment, the first gas comprises helium, and the second pressure gas therefore comprises a mixture of helium and hydrogen. According to this embodiment, the gas mixture at the second pressure typically comprises helium and from about 3% to about 12% hydrogen, and more typically comprises helium and from about 5% to about 10% hydrogen. In other possible embodiments of the first gas composition, the first gas can comprise hydrogen, or can comprise a mixture of helium and hydrogen. In the embodiment comprising a mixture of helium and hydrogen, the gas mixture typically comprises from about 3% to about 12% hydrogen, and more typically comprises about 5% hydrogen.

In another embodiment, it may be desirable to assemble the semiconductor chips into a package in the presence of a hydrogen-containing gas, in order to facilitate joining. The preferred hydrogen content of the hydrogen-containing gas is from about 5% to about 10% hydrogen, since this range of hydrogen gas will provide a safe reducing atmosphere.

The source of releasable hydrogen employed in the present invention is the thermal decomposition of a metal hydride, preferably in the form of a metal hydride thin film. Very high hydrogen pressures can be produced in proportionately small volumes by the simple thermal decomposition of various metal hydride thin films. For example, as described in U.S. Pat. No. 6,121,131 to J. M. Eldridge for "Method for Forming Conductive Structures," such pressures have been used to controllably deform and shape thin metal films. In a typical embodiment of the present invention, the pressure of the second pressure gas can range from 5 MPa to 50 MPa.

Figure 2:
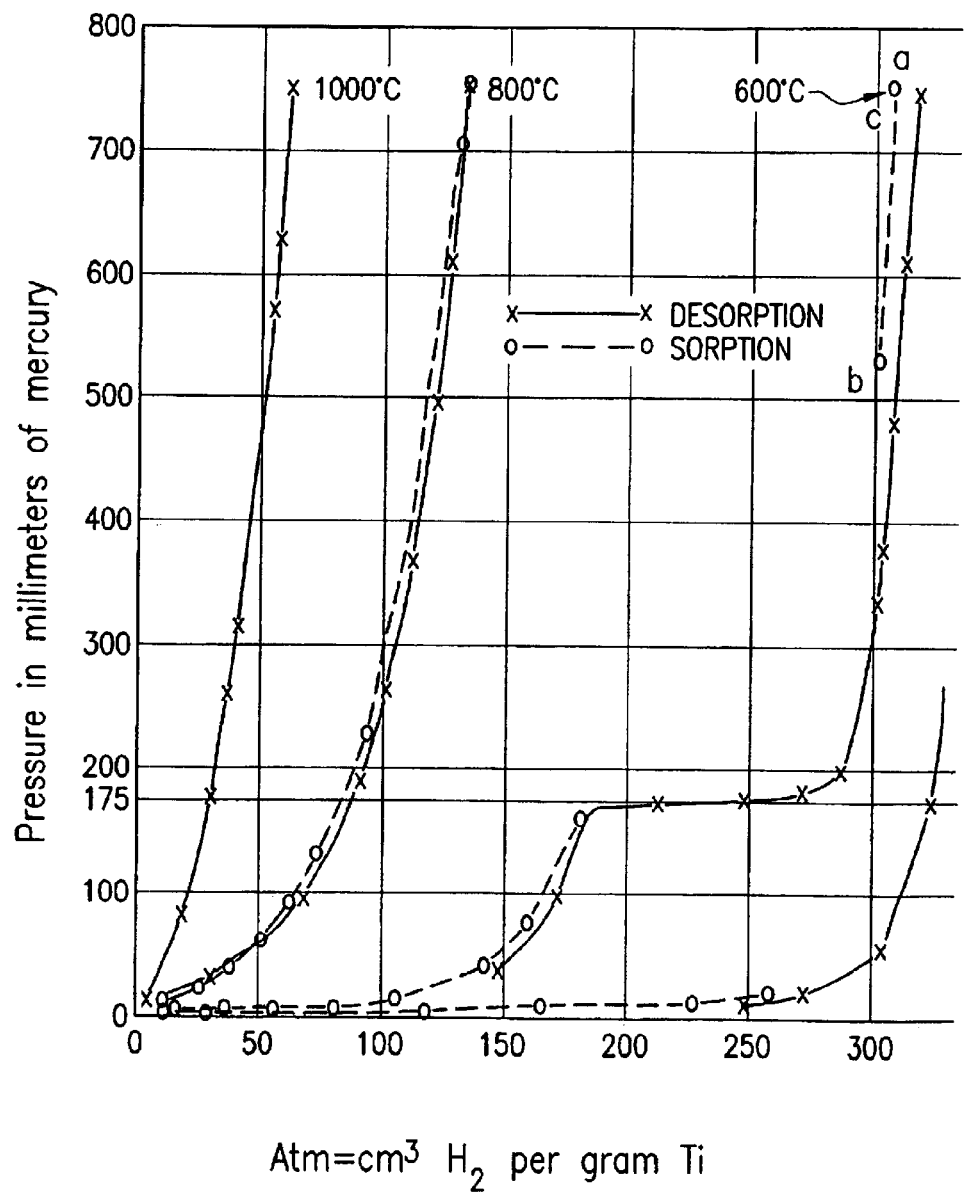
FIG. 2 is a graphical illustration of hydrogen concentration as determined by temperature to a first approximation for pressures above one-third of an atmosphere.

A large number of candidate metal hydrides are available for the various embodiments of the invention described herein. Hydride selection depends upon factors such as the package type, number of chips contained in each package, and joining and temperature processes. As is evident from FIG. 1, titanium, zirconium, chromium, vanadium, thorium, and tantalum form hydrides with varying hydrogen contents and ranges of temperature stability. *Scientific Foundations of Vacuum Techniques,* $2^{nd}$ Ed., Chapter 8, S. Dushman and J. M. Lafferty (John Wiley and Sons, 1962). FIG. 1 illustrates that the hydrogen concentrations fall off monotonically with increasing temperatures, i.e., $TiH_2$ is the most stable, and TaH the least stable. At a given temperature, the hydrogen content of such transition metals approaches a saturation value with increasing pressure above roughly 100 mm. The hydrogen concentration in titanium, for example, is determined by temperature to a first approximation pressures above one-third of an atmosphere. As is evident from FIG. 2, hydrogen permeation is very fast in these metals, even at temperatures of approximately 200 to 500° C.

For purposes of exemplifying the invention, the use of titanium hydride is described herein. $TiH_2$ is reasonably stable up to 600° C. under 1 atm of hydrogen. The hydrogen content then falls off sharply, reaching a value of roughly $TiH_{0.2}$ by 1000° C. Most of the hydrogen is released in the 700–800° C. range. The hydrogen permeability is high (roughly $10^{-7}$ moles/m $Pa^{1/2}$/s) from approximately 300 to 1,000° C.

For several reasons, the use of helium and hydrogen in conjunction with markedly elevated gas pressures is particularly beneficial. First, the thermal conductivities of hydrogen and helium are similar over a range of useful pressures and are significantly higher than those of alternative gases. Secondly, primarily due to the much larger size of the hydrogen molecule, the permeability (or, diffusivity) of hydrogen through metals, glasses and other packaging materials such as polymers is significantly smaller than that of helium. In some metals, however, hydrogen will diffuse in the atomic state, and will, therefore, have a diffusion rate that is higher than that of helium. Finally, the thermal conductivities of hydrogen and helium increase approximately linearly with their pressures at values well below their critical points.

Calculations show that the thermal conductivity of a pressurized hydrogen-helium mixture can be surprisingly high. For example, total pressures of 5 to 50 MPa yield thermal conductivities of approximately $1.6 \times 10^{-3}$ to $1.6 \times 10^{-2}$ cal-cm/sec-C, respectively. This compares to a value of $2.3 \times 10^{-2}$ for fused silica and $5.7 \times 10^{-5}$ for air at atmospheric pressure. Thus, a hydrogen/helium mixture at a pressure of 50 atm is nearly 300 times more thermally conductive than air at 1 atm pressure.

The volume of $TiH_2$ required to generate the desired pressure is proportional to the free volume in the package. Assuming, for example, that hydrogen release is only 75% efficient, $3.9 \times 10^{-5}$ cm$^3$ of $TiH_2$ would release sufficient hydrogen to fill a volume of 0.01 cm$^3$ to approximately 5 atm with hydrogen. Increasing the hydride volume by an order of magnitude provides a pressure of 50 atmospheres for the same free space. Conversely, reducing the free space by a factor of 10 for the same volume of hydride will also yield a pressure of 50 atm. See Table I. Clearly, therefore, it is important to minimize the free volume by careful package design and fabrication.

TABLE 1

TiH$_2$ Volumes (Area × Height)
Required To Yield Indicated H$_2$ Pressures

| Area, cm$^2$ | Height, microns | Free Volume, cm$^3$ | Pressure, atm |
|---|---|---|---|
| 1 | 5.7 | 1 | 1 |
| 1 | 28.5 | 1 | 5 |
| 1 | 0.057 | 0.01 | 1 |
| 1 | 0.285 | 0.01 | 5 |
| 1 | 0.0285 | 0.001 | 5 |
| 1 | 0.285 | 0.001 | 50 |
| 1 | 2.85 | 0.01 | 50 |

The results presented in Table 1 are calculated results, assuming 100% gas release, using the following relationships:

a) Moles of H$_2$ per cm$^3$ @ STP=1 cm$^3$/(2.24×10$^4$ cm$^3$/mole)=4.46×10$^{-5}$ moles H$_2$, and b) Volume of TiH$_2$ to yield the above-indicated number of moles of H$_2$=(4.46×10$^{-5}$ moles H$_2$)(50 g/mole TiH$_2$) (3.9 g/cm$^3$)=5.7×10$^{-4}$ cm$^3$, where the density of the hydride=3.9 g/cm$^3$. Because the free volume of a well-designed package will have less than approximately one millimeter of clearance between the chip and the package, the free volume of the interior of the package will be on the order of 0.01 cm$^3$ per cm$^2$ of chip area. Therefore, depending upon the amount of hydrogen desired and the thickness of the titanium films used, the area required to produce the hydrogen will be only a small fraction of the chip area.

Optimum gas compositions and pressures depend upon the particular package application. For example, in small packages, pure hydrogen is preferred since thermal conductivity is high, while loss of hydrogen via out-diffusion is negligible relative to that of helium. Safety exposures in a small package also tend to be insignificant. In larger packages, however, and in large scale manufacturing of small packages, it is desirable to have the capability for packaging chips in a non-explosive hydrogen-helium ambient atmosphere while retaining the reliability advantage provided by the presence of the slower-diffusing hydrogen. In all cases, the presence of hydrogen will facilitate welding, brazing, or otherwise providing excellent hermetic joints.

As described above, the source of releasable hydrogen employed in the present invention is the thermal decomposition of the metal hydride. The semiconductor package is pressurized to the desired pressure by heating the hydride very rapidly to temperatures sufficient to release the hydrogen. For example, for titanium hydride, temperatures in the 600 to 800° C. range will suffice to release most of the hydrogen. Heating times can be as short as approximately 1 microsecond, or longer if desired, depending upon the particular application. The thermal decomposition can be effected in two general ways. The first is by heating the metal hydride with a source of heat internal to the package, and the second is by heating with a source of heat external to the package.

In the first embodiment of the method of heating, the heating is typically done with a thin film resistance heater fabricated into a chip. The semiconductor package can comprise one (see FIGS. 3 and 4) or a plurality (see FIGS. 5, 6, and 21) of heaters and their associated heater circuitry for heating the metal hydride so as to effect the release of hydrogen.

Although the aforementioned thin film heater represents a very practical approach to providing the required heat, it is not the only solution which can be invoked. In a second embodiment of the method of heating, the source of heat is laser radiation or a similar intense energy source that is communicated through a "window" in the package (see FIGS. 12 and 15). This energy, impinging upon the hydride islands, heats and liberates the hydrogen. In order to quickly heat the hydride, this energy should be as highly concentrated as possible in order to minimize heating of the surrounding material, thus one or a plurality of relatively small "islands" of metal hydride material on each of at least one or a plurality of integrated circuit-bearing chips.

In the first general embodiment of the configuration, a relatively large area of metal hydride material is located on at least one or a plurality of hydrogen generation-dedicated chips, referred to herein as a "non-integrated circuit-bearing" chip. In this embodiment, the chip dedicated solely to hydrogen release contains a surface layer of metal hydride, i.e., a metal hydride thin film. Thus, the metal hydride is contained on a chip which has no other functional elements. If the internal heating source is employed, however, each of the at least one or a plurality of non-integrated circuit-bearing chips also comprises an underlying thin film heater and the associated heater circuitry.

Figure 3:
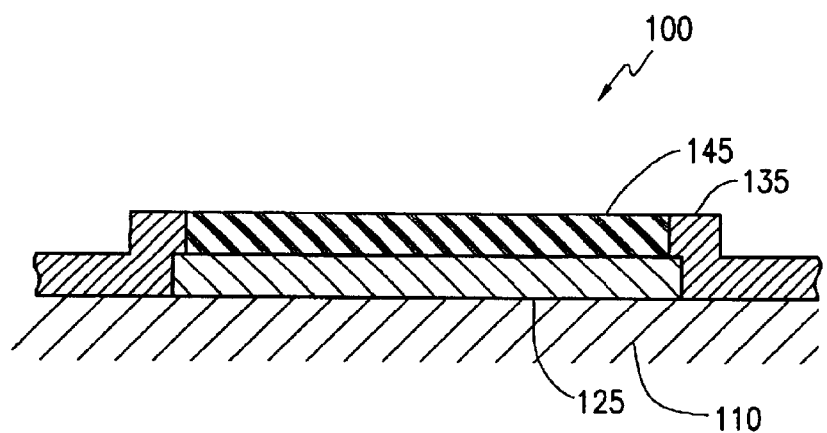
FIG. 3 is a cross-sectional view of a first embodiment of a metal hydride layer-containing chip.
Figure 4:
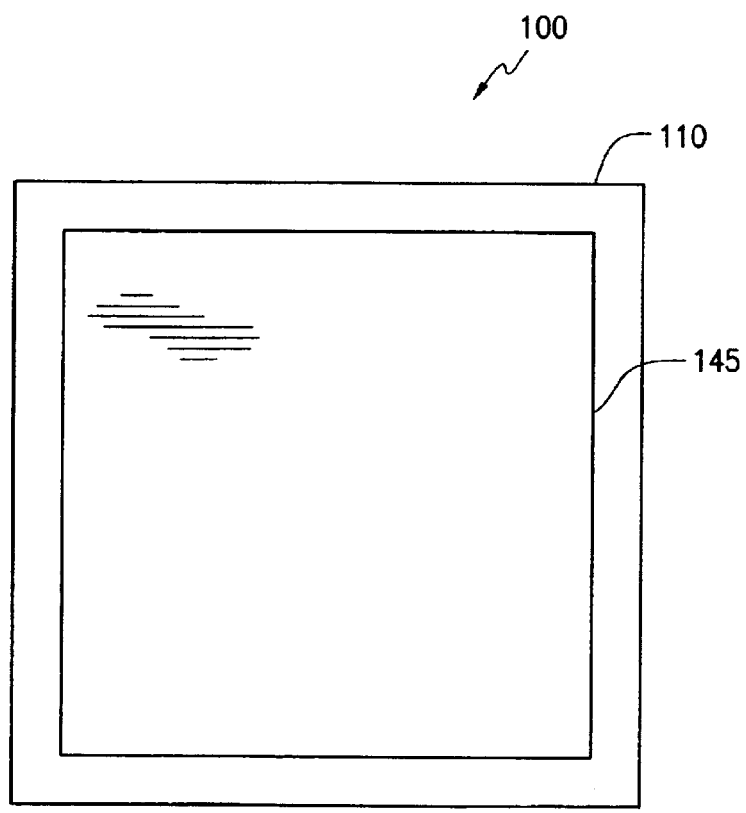
FIG. 4 is a schematic plan view of the embodiment depicted in FIG. 3.

More specifically, FIG. 3 is a cross-sectional view of the first embodiment of a metal hydride layer-containing chip 100. FIG. 4 is a schematic plan view of the embodiment depicted in FIG. 3. The chip 100 comprises a substrate 110, a thin film doped polycrystalline silicon resistor 125 disposed on substrate 110, electrical contacts 135 in communication with thin film resistor 125, and a thin film layer of metal hydride 145 disposed above thin film resistor 125. Once chip 100 has been charged with hydrogen (i.e., once the layer of hydride-forming metal has been charged with hydrogen to form the layer of metal hydride), the package includes an enclosure for sealing the package. (See FIG. 11 for the depiction of the enclosure 260 associated with the island-type embodiment of the chip 200.) enabling a more rapid cooling of the metal islands upon termination of the heating cycle. If a laser is employed, it is typically an eximer laser. The external heating method can be desirable, for example, when using a transparent cover plate on the semiconductor package (see FIG. 15).

Depending upon the particular application, the external heating embodiment may have at least two potential advantages over the internal heating embodiment. The first is the elimination of the requirement for the on-chip heaters, thus potentially saving both chip area and additional fabrication processing steps. The second advantage is that elimination of the heaters will facilitate a more rapid cooling of the metal hydride upon the termination of the heating cycle, because the thermal mass of the heaters has been eliminated.

According to one possible embodiment of the metal hydride-containing structure, the metal hydride is contained in a single chip. In another possible embodiment of the metal hydride-containing structure, the metal hydride is contained in a plurality of chips, i.e., within a package housing the plurality of chips.

Furthermore, as described in more detail below, various configurations of the metal hydride thin films within the chips and/or the package are possible. The configuration of the metal hydride can include, in a first embodiment, where needed to generate the pressure required in larger semiconductor packages, a relatively large area of metal hydride material on at least one or a plurality of hydrogen generation-dedicated chips. In a second embodiment, the configuration of the metal hydride can include at least According to this first embodiment of the configuration, chip 100 is uncomplicated by the presence of active integrated circuits on the same chip. As such, the entire chip surface can serve as a large-volume hydrogen gas generator and is, of course, simpler to fabricate. According to this first embodiment, the package may contain, depending upon the particular application, one or a plurality of the hydrogen generation-dedicated chips.

In a second general embodiment of the configuration, the at least one or a plurality of small islands of metal hydride material are located on each of at least one or a plurality of integrated circuit-bearing chips. That is, each of the chips comprises at least one or a plurality of surface locations of a layer of metal hydride, and the metal hydride is located upon the same chip as other functional units. If the internal heating source is employed (i.e., by heating the metal hydride with a source of heat internal to the package), each of the at least one or a plurality of integrated circuit-bearing chips also comprises a heater and the associated heater circuitry.

Figure 5:
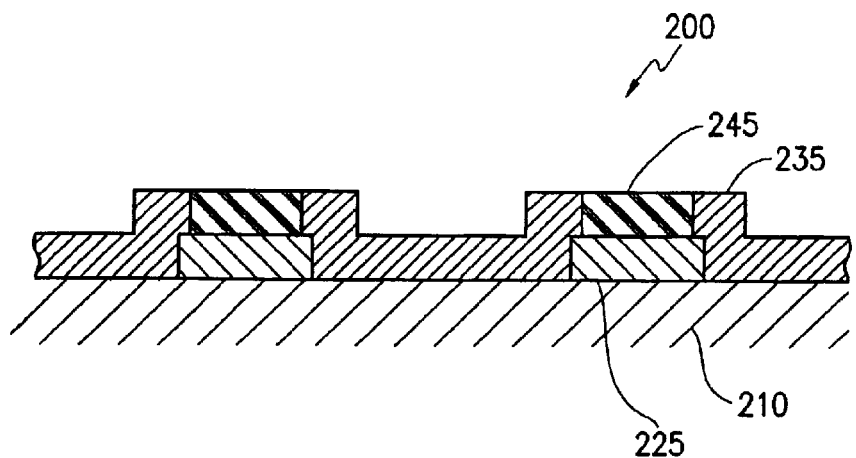
FIG. 5 is a partial cross-sectional view of a second embodiment of a metal hydride layer-containing chip.
Figure 6:
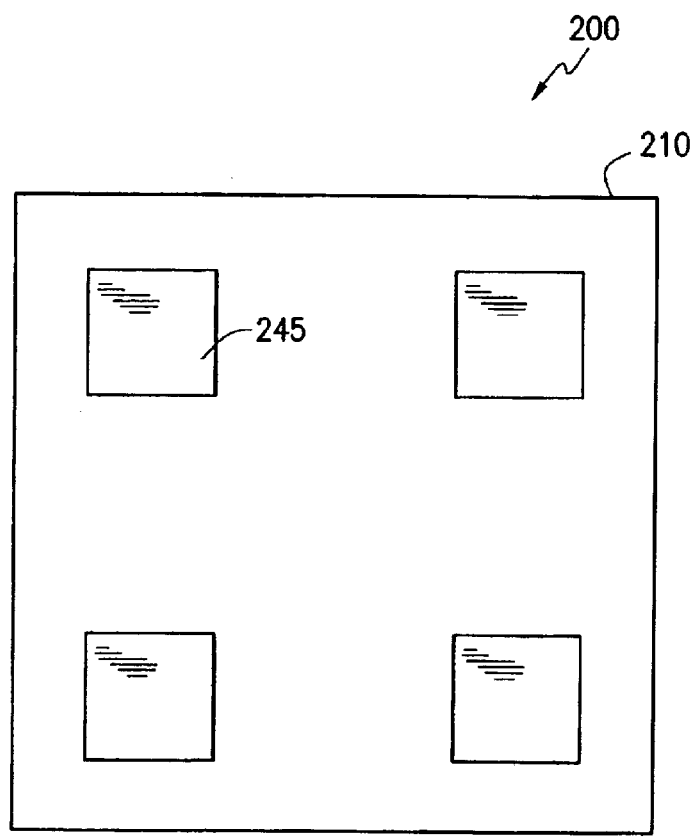
FIG. 6 is a schematic plan view of the embodiment depicted in FIG. 5.

More specifically, FIG. 5 is a partial cross-sectional view of the second embodiment of a metal hydride layer-containing chip 200. FIG. 6 is a schematic plan view of the embodiment depicted in FIG. 5. FIGS. 7A–F illustrate the fabrication (described in detail below) of the embodiment of the structure depicted in FIGS. 5 and 6.

Figure 11:
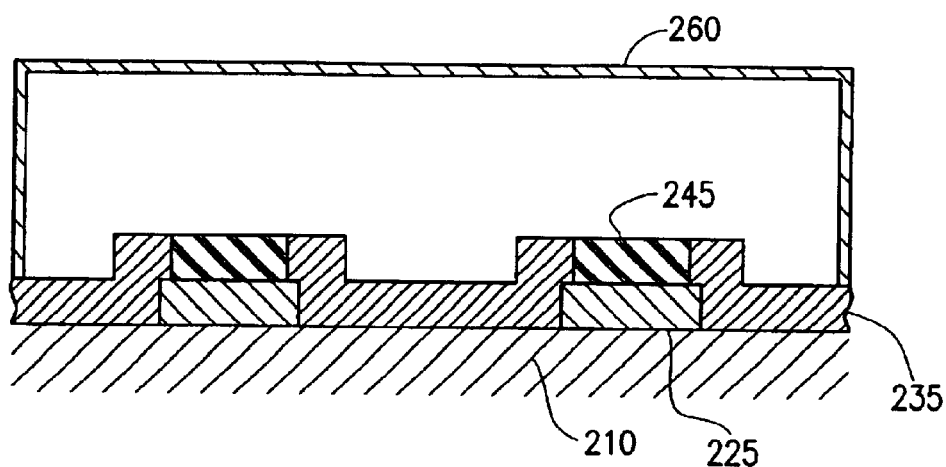
FIG. 11 is a cross-sectional view of the embodiment depicted in FIG. 5 enveloped within an enclosure.

According to this second embodiment of the configuration, chip 200 comprises a substrate 210 (FIG. 7A), at least one or a plurality of doped polycrystalline silicon thin film resistors 225 (FIG. 7B) disposed on substrate 210, electrical contacts 235 (FIG. 7D) in communication with the at least one or a plurality of thin film resistors 225, and at least one or a plurality of thin film layers of metal hydride 245 (FIGS. 5 and 7F) disposed above a respective one of the at least one or a plurality of thin film resistors 225. Once the package has been charged with hydrogen to form the at least one or a plurality of thin film layers of metal hydride 245 (i.e., once the at least one or a plurality of layers of hydride-forming metal have been charged with hydrogen to form the at least one or a plurality of layers of metal hydride), the package includes an enclosure 260 (FIG. 11) for sealing the package prior to pressurizing the package. FIG. 11 is a cross-sectional view of the embodiment depicted in FIG. 5 enveloped within enclosure 260.

In a typical embodiment, substrate 210 is silicon, and therefore an upper surface of the silicon substrate is oxidized. Thin film resistors 225 comprise doped (or subsequently implanted) polycrystalline silicon.

Figure 23:
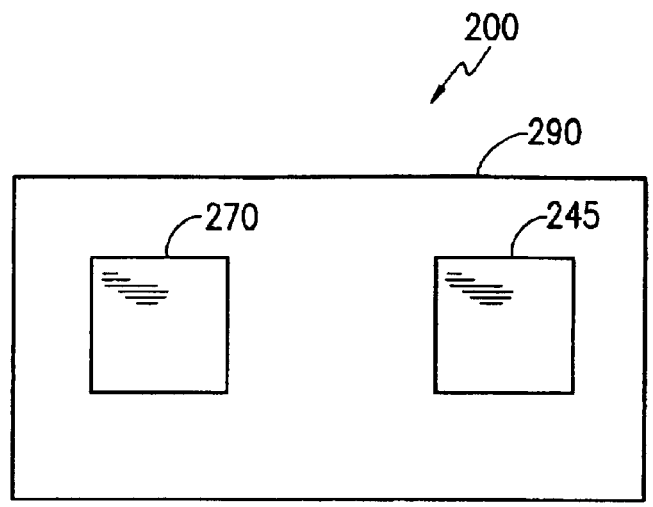
FIG. 23 is a schematic plan view of the embodiment of the structure illustrated in FIGS. 5 and 6, and depicts in more detail an integrated circuit and a thin film layer of metal hydride on a single die.

FIG. 23 is a more detailed schematic plan view of the embodiment of the structure 200 generally depicted in FIGS. 5 and 6. FIG. 23 depicts integrated circuit 270 and one of the at least one or a plurality of thin film layers of metal hydride 245 on die 290.

Figure 8A:
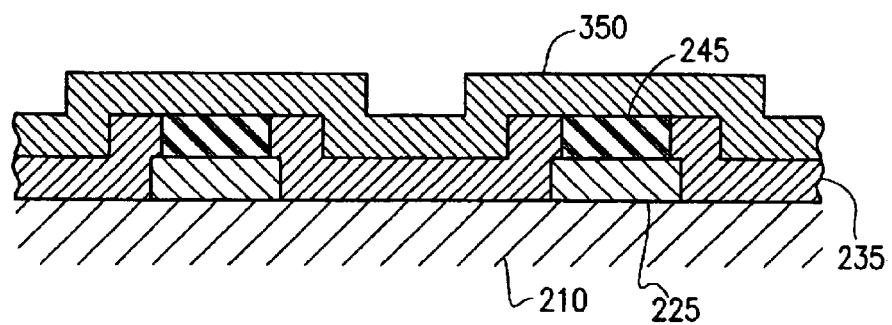
FIGS. 8A and B illustrate the fabrication of another embodiment of the structure depicted in FIGS. 5 and 6.

FIGS. 8A and 8 illustrate another optional embodiment of the structure depicted in FIGS. 5 and 6. In this embodiment, chip 300 further comprises at least one low-temperature deposition layer 355. As used herein, "low-temperature deposition" means the deposition of a layer that can be effected at a temperature that is lower than the temperature at which the metal layer is charged with hydrogen during formation of the metal hydride layer. According to this embodiment, the at least one or a plurality of thin film layers of metal hydride 245 remain uncovered by the at least one low-temperature deposition layer 355.

Figure 18:
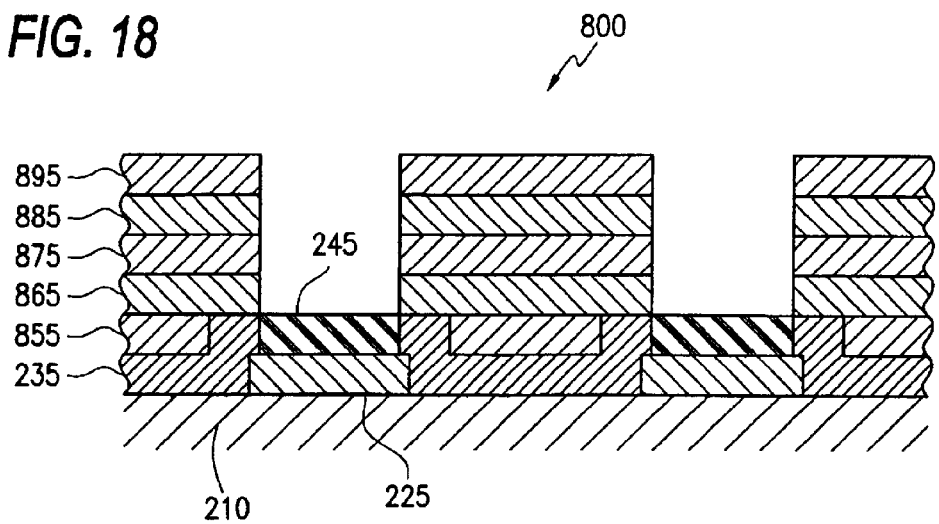
FIG. 18 illustrates another embodiment of the structure depicted in FIG. 7F in which the structure includes a plurality of low-temperature deposition layers.

FIG. 18 illustrates another optional embodiment of the structure depicted in FIGS. 5 and 6. In this embodiment,
chip 800 further comprises a plurality of low-temperature deposition layers 855, 865, 875, 885, and 895. According to this embodiment, the at least one or a plurality of thin film layers of metal hydride 245 remain uncovered by the plurality of low-temperature deposition layers 855, 865, 875, 885, and 895.

Figure 9A:
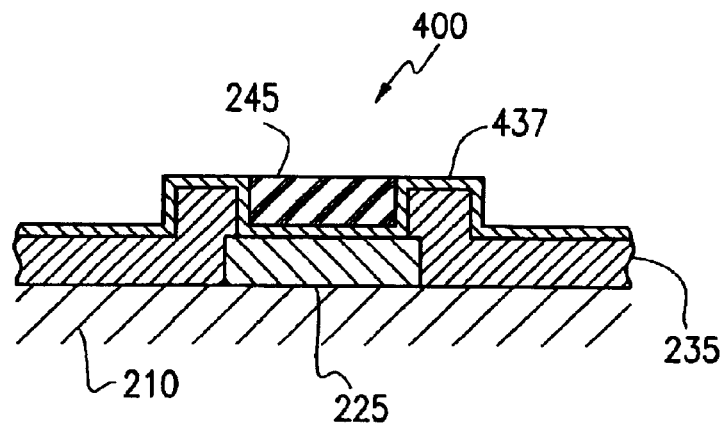
FIGS. 9A and B illustrate the fabrication of still another embodiment of the structure depicted in FIGS. 5 and 6.

FIGS. 9A and B illustrate optional embodiments of the structure depicted in FIGS. 5 and 6. In optional embodiment depicted in FIG. 9A, the chip 400 further comprises an insulating layer 437 disposed between i) the at least one or a plurality of thin film resistors 225 and electrical contacts 235 and ii) the at least one or a plurality of thin film layers of metal hydride 245.

In optional embodiment depicted in FIG. 9A, the chip 400 further comprises an insulating layer 437 disposed between i) the at least one or a plurality of thin film resistors 225 and electrical contacts 235 and ii) the at least one or a plurality of thin film layers of metal hydride 245. In this embodiment, the thickness of insulating layer 437 is at least partially determined by heat transfer considerations. That is, while insulating layer 437 must be thick enough to provide the desired degree of insulation, insulating layer 437 must also be thin enough so as to enable heat transfer from thin film resistors 225 to metal hydride 245.

Figure 9B:
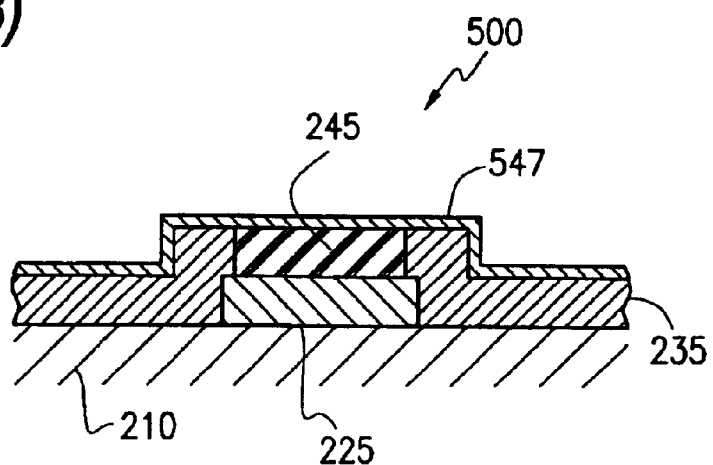

In optional embodiment depicted in FIG. 9B, the chip 500 further comprises an insulating layer 547 disposed above the electrical contacts 235 and the at least one or a plurality of thin film layers of metal hydride 245. In this embodiment, the thickness of insulating layer 547 is at least partially determined by mass transfer considerations. That is, insulating layer 547 must be thick enough to provide the desired degree of insulation. Insulating layer 547 must also be thin enough so as to enable diffusion of hydrogen to the hydride-forming metal during charging, and diffusion of hydrogen from metal hydride 245 during heating. In a typical embodiment, insulating layer 437 and 547 are $SiO_2$.

Figure 21:
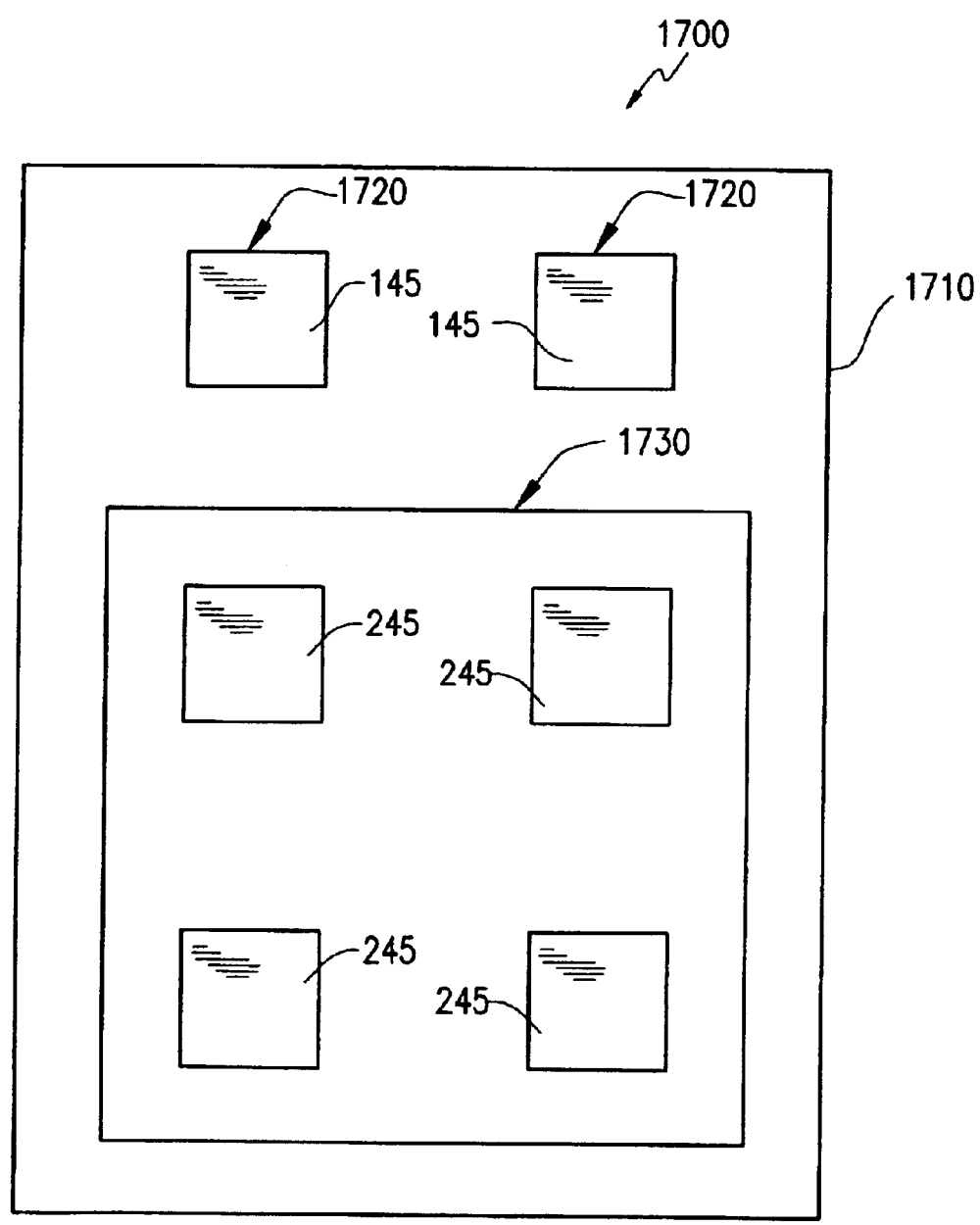
FIG. 21 illustrates another embodiment of the structures depicted in FIGS. 4 and 6 in which the structure includes a plurality of integrated circuit-bearing chips and a plurality of non-integrated circuit-bearing chips.

In another possible embodiment of the configuration 1700 as depicted in FIG. 21, the source of releasable hydrogen comprises a combination of the first (100) and second (200) embodiments of the configuration. That is, configuration 1700 comprises on substrate 1710 at least one or a plurality of non-integrated circuit-bearing chips 1720, each of the chips 1720 comprising a surface layer of metal hydride 145, and at least one or a plurality of integrated circuit-bearing chips 1730, each of the chips 1730 comprising at least one or a plurality of surface locations of a layer of metal hydride 245. If the internal heating source is employed, each of the at least one or a plurality of non-integrated circuit-bearing chips 1720 also comprises a heater and associated heater circuitry, and each of the at least one or a plurality of integrated circuit-bearing chips 1730 also comprises a heater and the associated heater circuitry.

Figure 24:
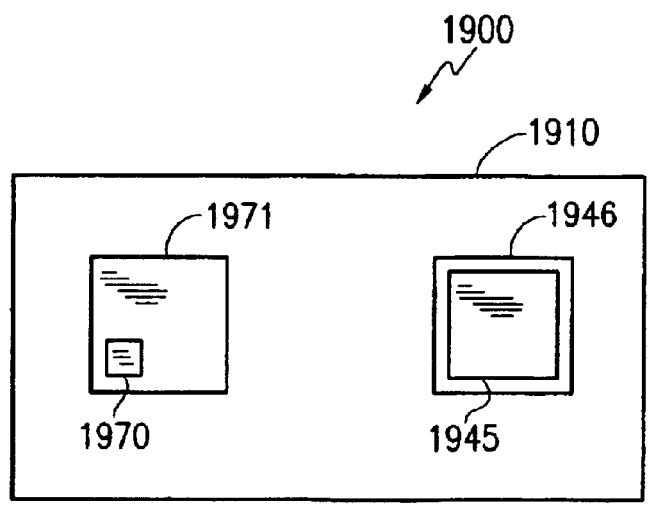
FIG. 24 is a schematic plan view of an embodiment of the structure which includes a package having an integrated circuit on a first die and a thin film layer of metal hydride on a second die.

FIG. 24 is a schematic plan view of an embodiment of the structure which includes a package 1900 having an integrated circuit 1970 on a first die 1971 and a thin film layer of metal hydride 1945 on a second die 1946. First die 1971 and second die 1946 are commonly packaged on base 1910. For purposes of illustration, first die 1971 is depicted as having a single integrated circuit 1970, but could include a plurality of integrated circuits. Similarly, first die 1971 could also include one or a plurality of thin film layers of metal hydride. Second die 1946, instead of having the single thin film layer of metal hydride 1945, could similarly have one or a plurality of the islands of a thin film layer of metal hydride.

Figure 12:
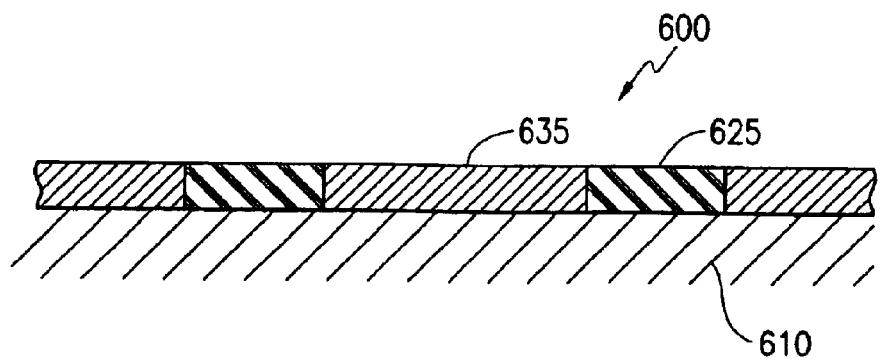
FIG. 12 is a partial cross-sectional view of a third embodiment of a metal hydride layer-containing chip.

In a third general embodiment of the configuration, the chip or package of chips is configured for use with the external heating source. FIG. 12 is a partial cross-sectional view of the third embodiment 600 of a metal hydride layer-containing chip. FIGS. 13A–D illustrate the fabrication (described in detail below) of the embodiment of the structure depicted in FIG. 12.

According to this third embodiment of the configuration, chip 600 comprises a substrate 610, and at least one or a plurality of thin film layers of metal hydride 625 disposed upon substrate 610. Once chip 600 has been charged with hydrogen to form the at least one or a plurality of thin film layers of metal hydride 625, the chip includes an enclosure for sealing the chip prior to pressurizing the chip. (See FIG. 11 for the depiction of the enclosure 260 associated with the island-type embodiment of the chip 200.)

As with chip 200, in a typical embodiment, substrate 610 is silicon, and therefore an upper surface of the silicon substrate is oxidized. Thin film resistors 625 comprise doped (or subsequently implanted) polycrystalline silicon.

Figure 19:
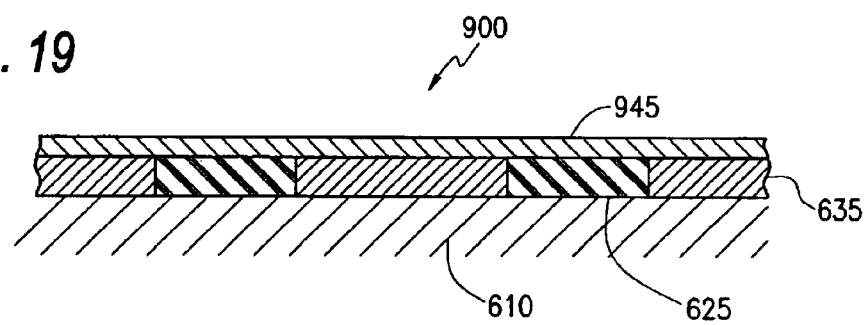
FIG. 19 illustrates another embodiment of the structure depicted in FIG. 13D in which the structure includes an insulating layer.

In an optional embodiment (depicted in FIG. 19) of chip 600, chip 900 further comprises an insulating layer 945 disposed above the at least one or a plurality of thin film layers of metal hydride 625. As with chip 200, in this embodiment the insulating layer must be thin enough so as to enable diffusion of hydrogen to the hydride-forming metal during charging, and diffusion of hydrogen from metal hydride 625 during heating. In a typical embodiment, the insulating layer is $SiO_2$.

Figure 20:
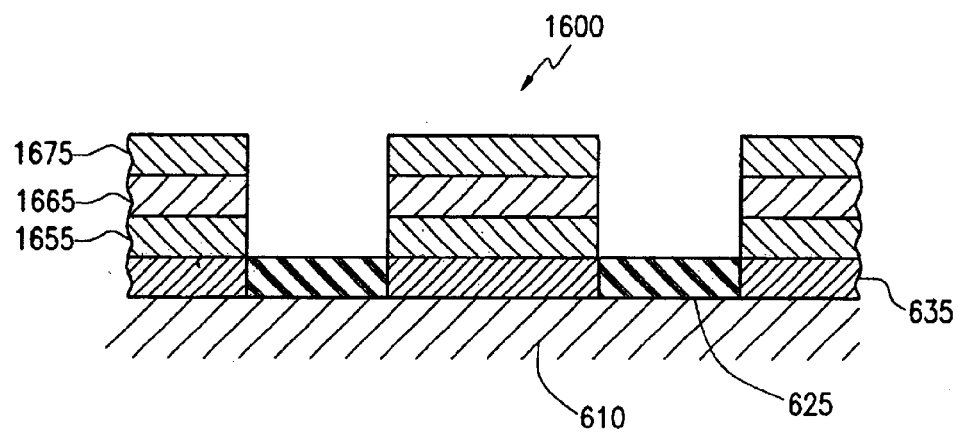
FIG. 20 illustrates another embodiment of the structure depicted in FIG. 13D in which the structure includes a plurality of low-temperature deposition layers.

In another optional embodiment (depicted in FIG. 20) of chip 600, chip 1600 further comprises at least one or a plurality of low-temperature deposition layers 1655, 1665, and 1675. According to this embodiment, the at least one or a plurality of thin film layers of metal hydride 625 remain uncovered by the at least one or a plurality of low-temperature deposition layers 1655, 1665, and 1675.

Figure 25:
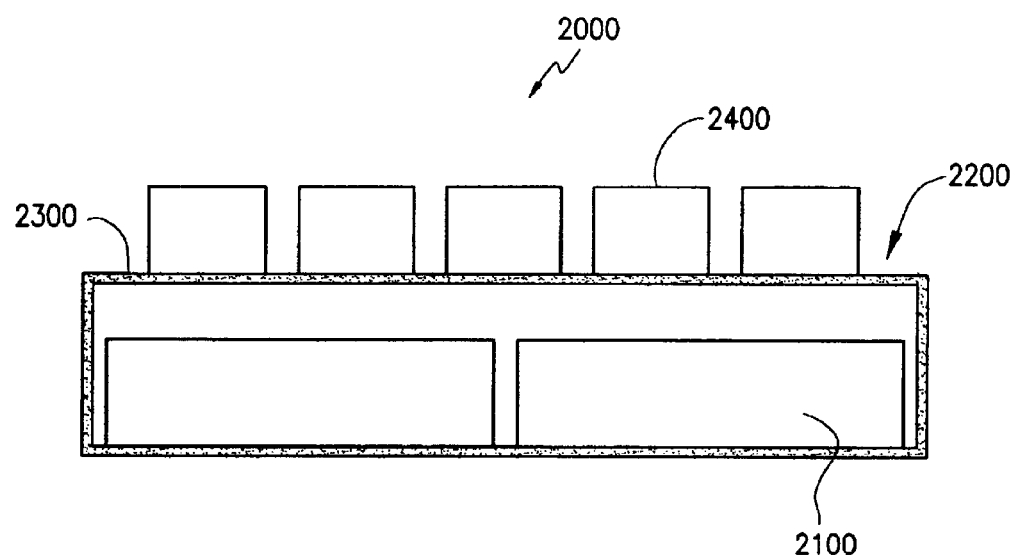
FIG. 25 is a schematic cross-sectional view of a package with supplemental heat removal capability.

In still another possible embodiment of the chip structure, the chip can be attached to the substrate by the use of a "controlled collapse chip connection" (i.e., a "C4" structure) in which solder bumps are bonded directly to the substrate by reflowing the solder bumps. In even another possible embodiment depicted in FIG. 25, a package 2000 with supplemental heat removal capability may include an attached heat sink, such as, for example, fins 2400. In this embodiment, package 2200 with enclosed chips 2100 includes the heat sink 2400 in communication with the package 2200 through enclosure 2300 to even further enhance the heat removal effect.

The method of fabrication to be employed depends upon which of the above-described structures and configurations is to be manufactured. In general, however, the metal hydride film is fabricated using conventional integrated circuit processes, and is then charged with hydrogen just prior to the application of the enclosure, e.g., a cover plate. Hydrogen charging can be done under a pressure of 1 atm in an $H_2$ or $H_2$—He ambient environment, using commercially available equipment for metallurgically joining plates and packages.

The package is subsequently pressurized to the desired pressure by heating the hydride very rapidly to a temperature that is sufficient to release the hydrogen. As indicated above, for titanium hydride, a temperature in the range of 600 to 800° C. will suffice to release most of the hydrogen. The heating time can be as brief as approximately 1 microsecond, or longer if desired, depending upon the particular application.

Once the package has been pressurized, the metal hydride film is cooled at a rate that is sufficient to prevent or greatly minimize the undesired re-absorption of hydrogen into the film. The extremely small thermal mass of the metal hydride coupled with the use of high thermal conductivity supporting materials (e.g., silicon) virtually ensures that such a cooling rate can be achieved. Package geometry and the small gas passageways provided also serve to reduce the conductance of hydrogen in its gas phase. Thus, heating can be done over 10 or more microseconds in order to allow hydrogen gas to diffuse throughout the package, but cooling is typically completed in a shorter period of time.

A package can be pressurized immediately after assembly and joining, or, at a later time in order to compensate for any helium or hydrogen which may be lost via leakage during the life of the package. The electrical resistance of a heated air-bridge test element can be monitored in order to detect the pressure within the package. If desired, a feedback circuitry can be provided for correcting unwanted deviations from the desired internal hydrogen pressure by activating the hydride source as necessary.

A first embodiment of the method of fabrication is directed to manufacture of the hydrogen release-dedicated chip. Because this chip is uncomplicated by the presence of active integrated circuits, it is simpler to fabricate. For purposes of exemplifying the method, the metal hydride has been described herein as titanium hydride. The chip fabrication can proceed generally as follows, although one skilled in the art will recognize that alternatives can be followed (some of which are described in detail after the following general description) without altering the nature of the invention.

The substrate can be, for example, a silicon substrate (but need not necessarily be semiconductor grade), a multi-layered ceramic, a fused silica cover plate, or another cover plate.

If the substrate is silicon, the substrate is oxidized and a layer of doped polycrystalline silicon (i.e., "polysilicon") is deposited thereon. Alternatively, if the polysilicon is undoped, it can be implanted after deposition. The silicon film is patterned (i.e., processed) to form at least one or a plurality of heat sources, i.e., thin film resistors that serve as the underlying heaters when connected electrically to an external power source. As employed herein, the terms "patterned" and "patterning" are synonymous with "processed" and "processing," i.e., employing photolithographic techniques comprising masking and etching.

In an optional embodiment, an insulating layer (e.g., $SiO_2$) can be added to chemically protect and electrically isolate the resistors.

A layer of hydride-forming metal, e.g., a titanium film, is deposited and patterned so as to cover most of the polycrystaline silicon. The exposed ends of the of the polycrystalline silicon are left uncovered until suitable thin film electrodes are added and then passivated with, e.g., another oxide. Such electrical connections to the polycrystalline silicon and external power sources are known, and are not further described herein.

In the design of this passivated resistor/titanium structure, finite element analysis calculations are employed to optimize dimensions (e.g., film thickness) for the total structure. The purpose of such calculations is to maximize the amount of heat transferred into the titanium film when the heater is powered on, while at the same time minimizing both the heating and cooling times. Depending upon the particular application, the layer of hydride-forming metal typically has a thickness of from approximately less than 1 micron to several microns.

Charging of the titanium with hydrogen (i.e., the conversion to hydride) can be done in a relatively short period of time. Estimates based on bulk permeability values indicate that charging can be completed within a few seconds at temperatures of 500° C., using an external hydrogen pressure of 1 atm. Charging under a pressure of 5 atm, for example, would reduce this time by a factor of 5. Raising the charging temperature from 500 to 600° C. lowers the charging time by another factor of 10. Accordingly, there is wide latitude in optimizing processing conditions for forming the hydride material. Thus, much thicker Ti films (i.e., many microns thick) can be charged with hydrogen in very short periods of time by suitably raising temperature and pressure. Conversely, much thinner films can be charged equally quickly using lower temperatures and pressures. Actual process variables will depend on the particular package design and service requirements.

A second embodiment of the method of fabrication is directed to manufacture of the integrated circuit-bearing chip having at least one or a plurality of islands of metal hydride. In planning the chip layout, locations are reserved for islands of metal hydride and the associated resistor or resistors which serve as the underlying heater.

The heater is formed during the last of the "hot" processing steps so that upon completion of the last high temperature process, a layer of hydride-forming metal (e.g., titanium) can be deposited. The appropriate photo mask is applied such that at least one or a plurality of islands of hydride-forming metal can be isolated in areas of the chip above the underlying heater or heaters. The chip is then exposed to hydrogen at a temperature that is less than or equal to the last high temperature to which the chip was exposed. If the last temperature involved, for example, was a 900° C. oxidation, then the hydride is formed at this or a lower temperature.

The processing of the chip is then continued with the low-temperature depositions. As used herein, "low-temperature" deposition means the deposition of a layer that can be effected at a temperature that is less than the temperature at which the metal layer is charged with hydrogen so as to form the metal hydride layer. As each layer of the chip is deposited, care is taken to ensure that each island of hydride is not completely covered.

Figure 10A:
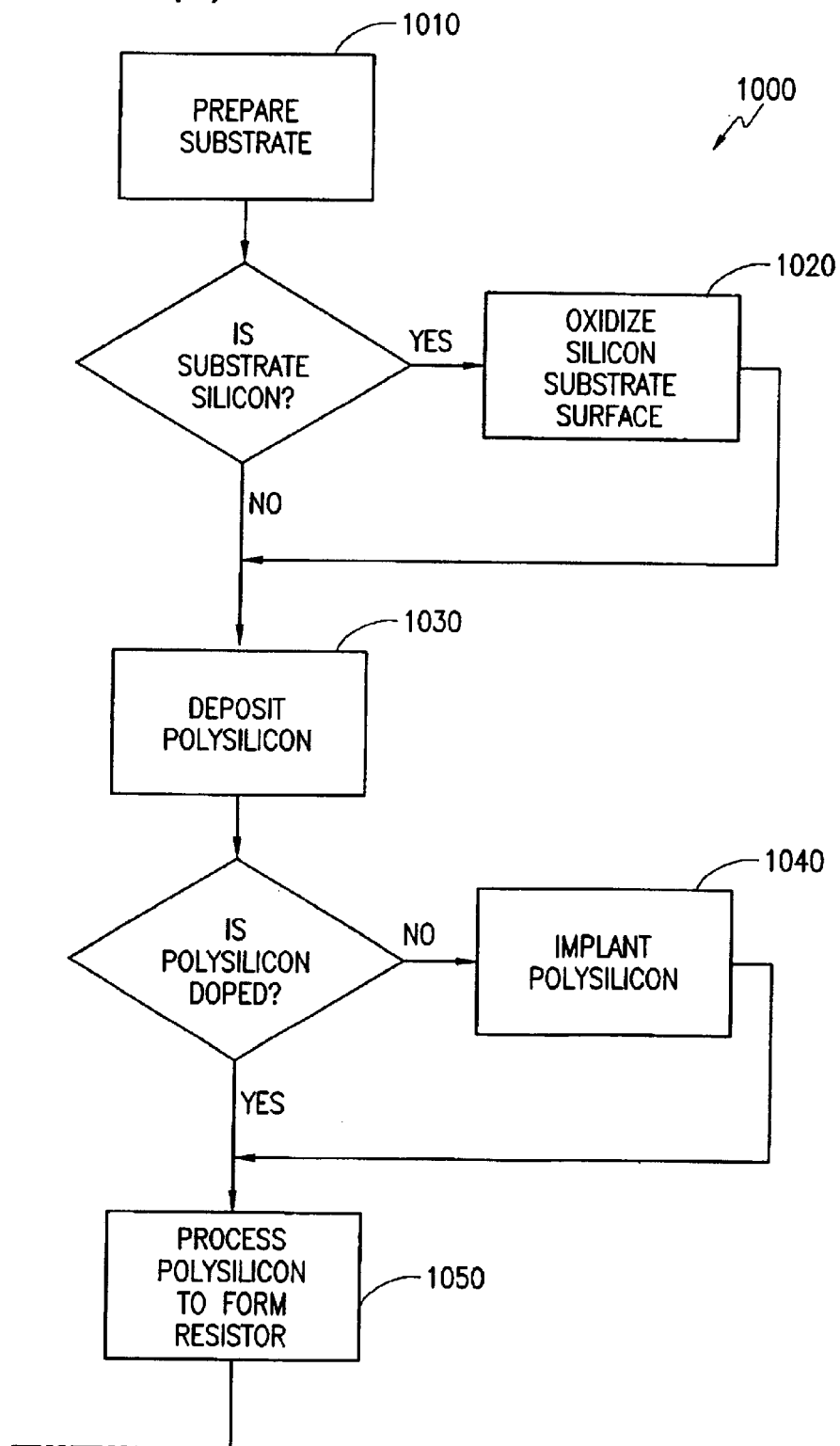
FIGS. 10A–C are a flow diagram of the fabrication sequence corresponding to FIGS. 7A–F, 8A and B, and 9A and B.
Figure 10B:
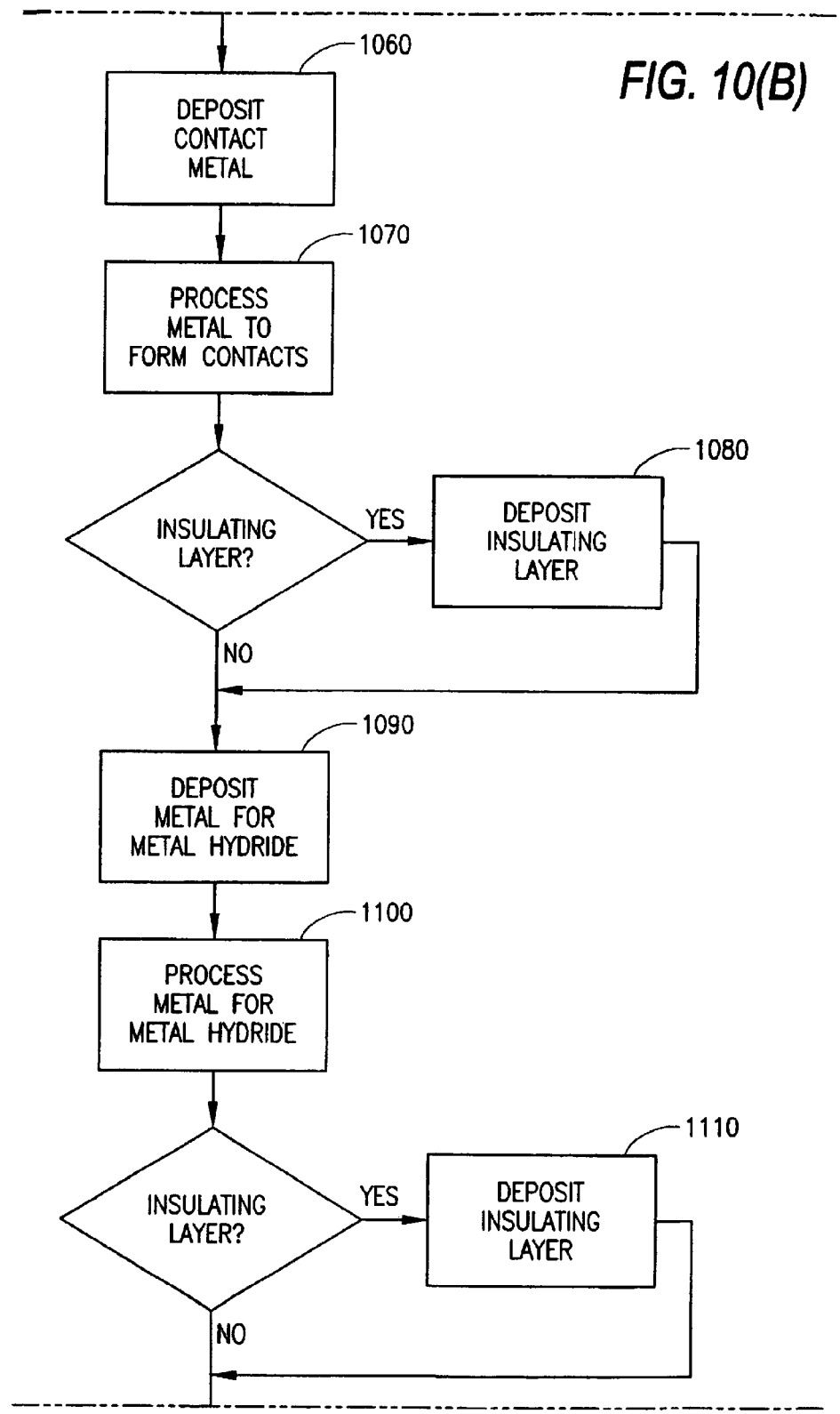
Figure 10C:
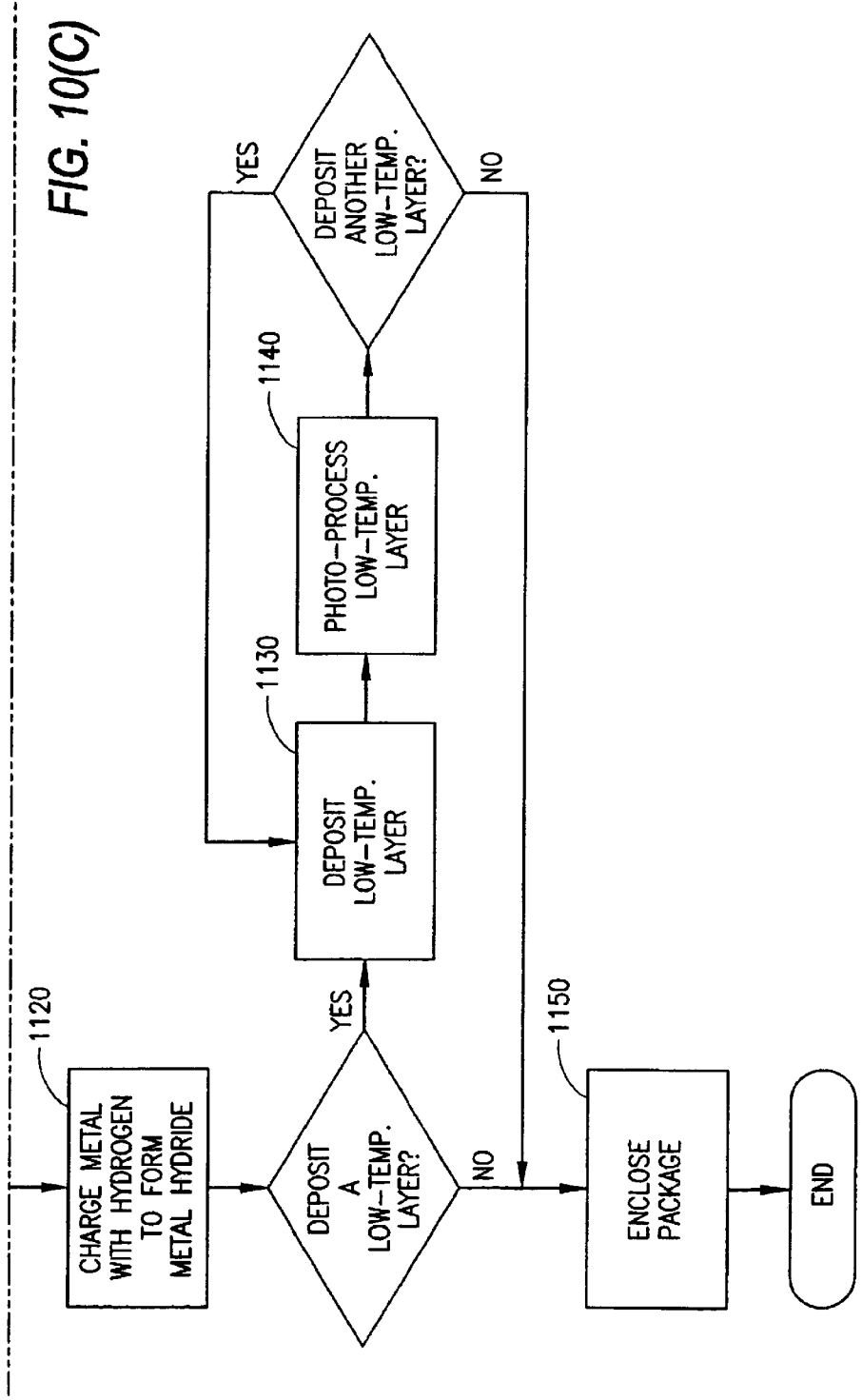

More specifically, FIGS. 10A–C are a flow diagram of the fabrication sequence 1000 corresponding to FIGS. 7A–F, 8A and B, and 9A and B. The method also pertains generally to fabrication of the "non-integrated circuit-bearing" chip 100. This embodiment of the method of fabricating a hydrogen-charged semiconductor package comprises the following steps.

Figure 7A:
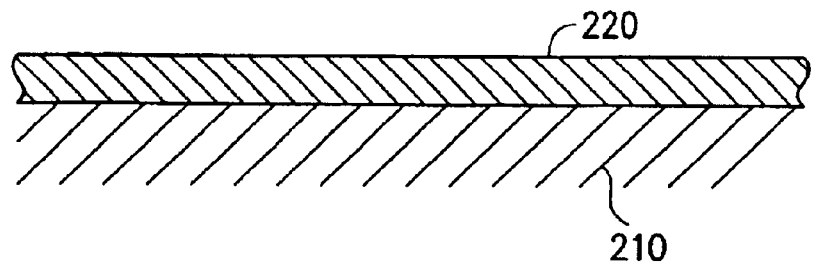
FIGS. 7A–F illustrate the fabrication of the embodiment of the structure depicted in FIGS. 5 and 6.
Figure 7B:
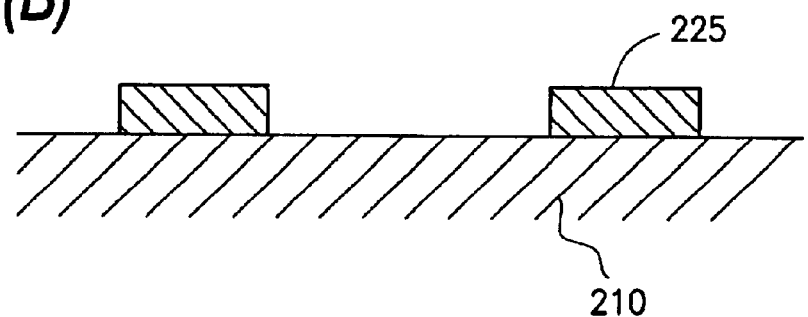
Figure 7C:
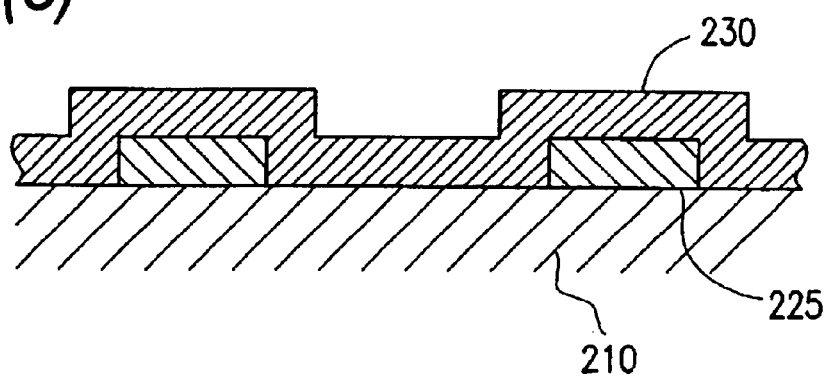
Figure 7D:
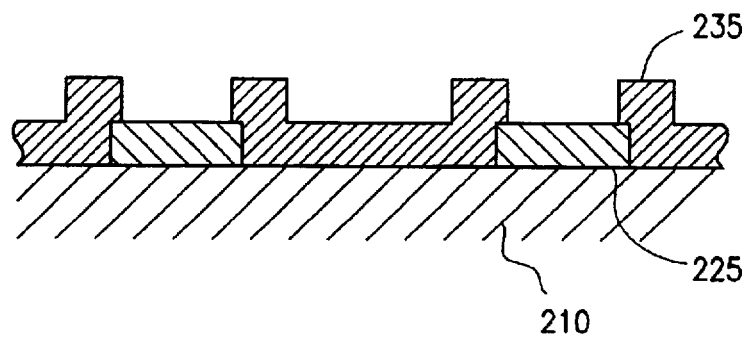
Figure 7E:
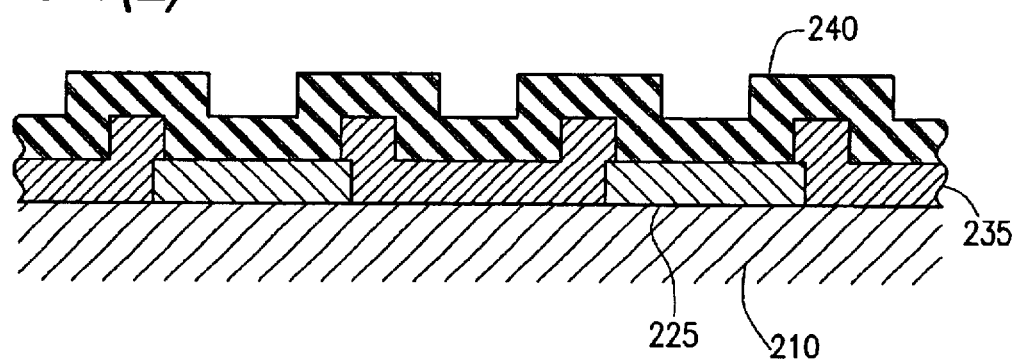
Figure 7F:
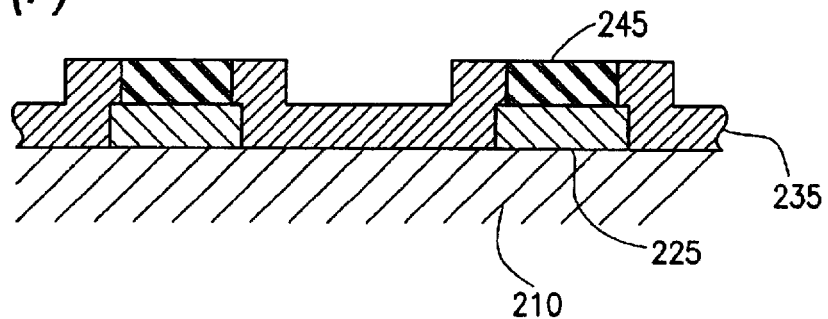

After preparing a substrate 210 (FIG. 7A) (step 1010), a layer of polycrystalline silicon 220 (FIG. 7A) is deposited (step 1030) upon prepared substrate 210. The deposited layer of polycrystalline silicon 220 is processed (step 1050) to remove portions of the deposited layer of polycrystalline silicon 220 and form at least one or a plurality of thin film resistors (225)(FIG. 7B). A layer of electrical contact metal 230 (FIG. 7C) is deposited upon an area where polycrystalline silicon has been removed, and upon the at least one or a plurality of thin film resistors 225 (step 1060). The deposited layer of electrical contact metal 230 is processed to remove portions of the deposited layer of electrical contact metal 230 and form electrical contacts 235 (FIG. 7D)(step 1070). A layer of hydride-forming metal 240 (FIG. 7E) is deposited upon the at least one or a plurality of thin film resistors 225, and upon electrical contacts 235 (step 1090). The layer of hydride-forming metal 240 is processed to remove portions of the layer of hydride-forming metal 240 and form at least one or a plurality of thin film layers of hydride-forming metal 245 (FIG. 7F)(step 1100). The at least one or a plurality of thin film layers of hydride-forming metal 245 are then charged with hydrogen (step 1120) to form at least one or a plurality of thin film layers of metal hydride so as to provide a hydrogen-charged package. The hydrogen-charged package is then enclosed.

Optional embodiments of the method of fabrication depicted in FIGS. 10A–C include, for example, the following. If substrate 210 is silicon, the method can further comprise oxidizing a surface of substrate 210 (step 1020). If polycrystalline silicon 220 has not been doped prior to deposition (i.e., so as to provide polycrystalline silicon 220 with a resistivity appropriate for the particular service), the method can further comprise implanting the deposited polycrystalline silicon (step 1040).

If desired, the method can further comprise, before the step 1090 of depositing the layer of metal for metal hydride, depositing upon the at least one or a plurality of thin film resistors 225 (FIG. 9A), and upon the electrical contacts 235 (FIG. 9A), an insulating layer 437 (FIG. 9A)(step 1080). Alternatively, the method can comprise, before the step 1120 of charging the at least one or a plurality of thin film layers of hydride-forming metal with hydrogen, depositing upon the at least one or a plurality of thin film layers of hydride-forming metal 245 (FIG. 9B), and upon the electrical contacts 235 (FIG. 9B), an insulating layer 547 (FIG. 9B)(step 1110).

Figure 8B:
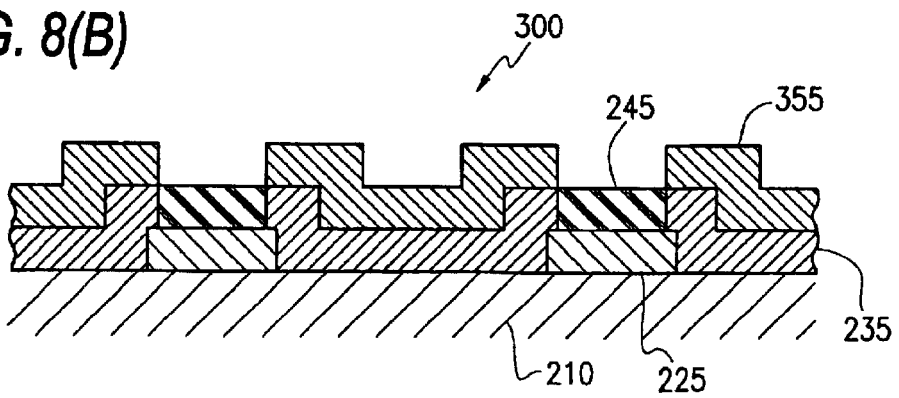

In still another optional embodiment, the method can further comprise, before the step 11150 of enclosing the package, depositing (step 1130) and processing (step 1140) at least one or a plurality of low-temperature deposition layers 350 (FIG. 8A), wherein the at least one or a plurality of processed thin film layers of metal hydride 245 (FIG. 7F) remain uncovered by the at least one or a plurality of low-temperature deposition layers 355 (FIG. 8B).

Figure 16A:
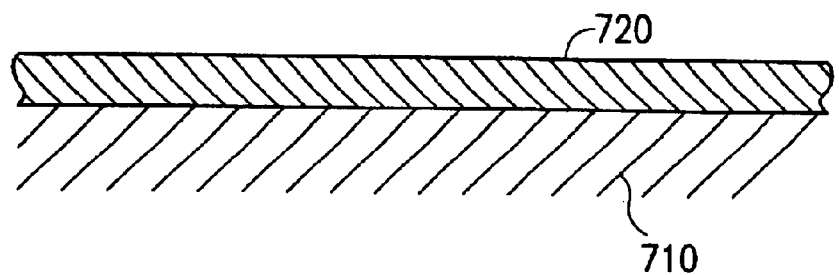
FIGS. 16A–F illustrate another embodiment of the fabrication of the structure depicted in FIGS. 5 and 6.
Figure 16B:
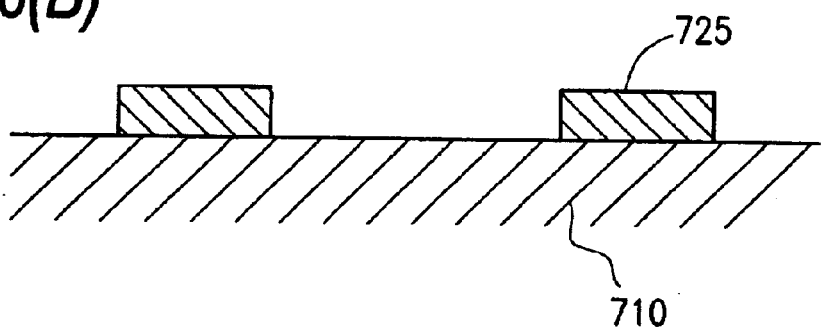
Figure 16C:
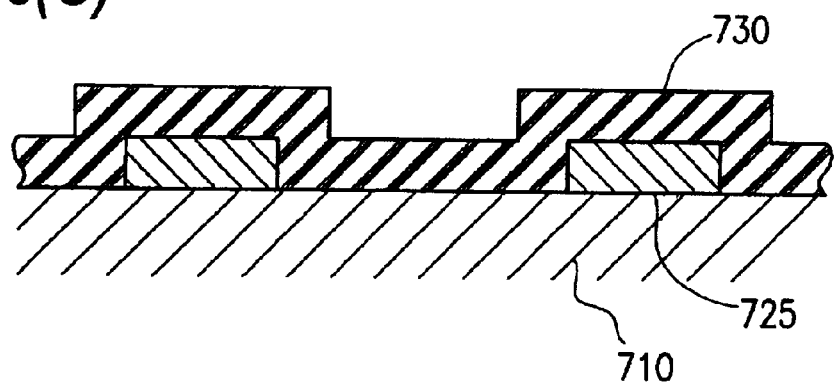
Figure 16D:
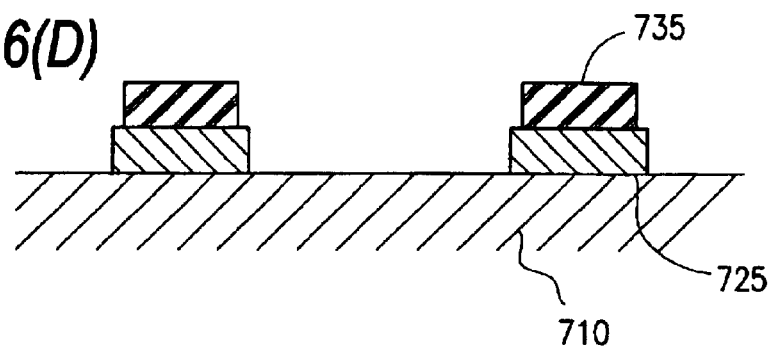
Figure 16E:
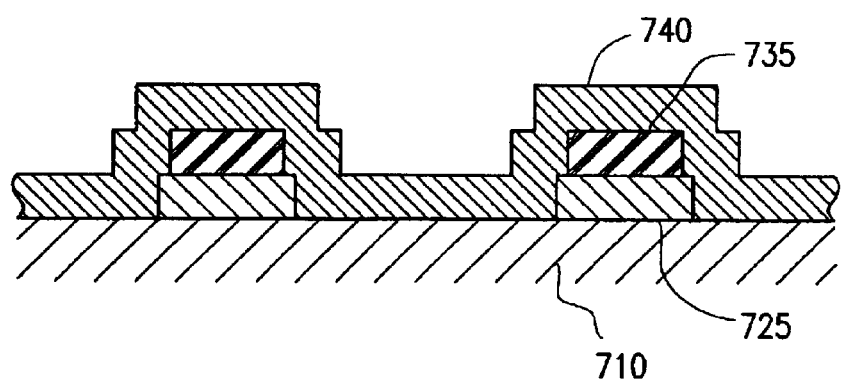
Figure 16F:
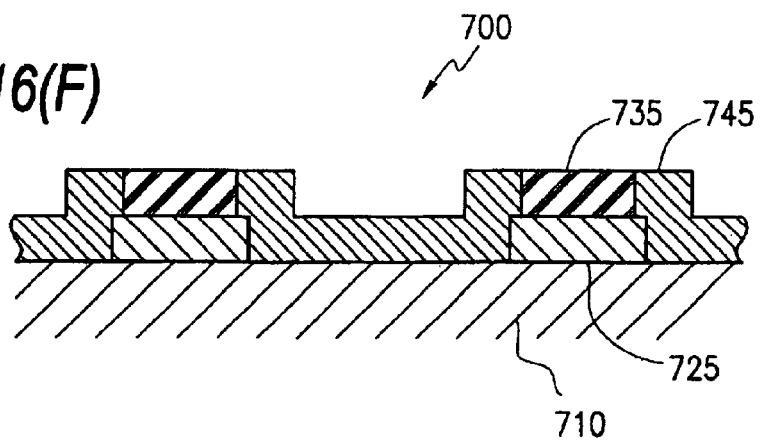
Figure 17B:
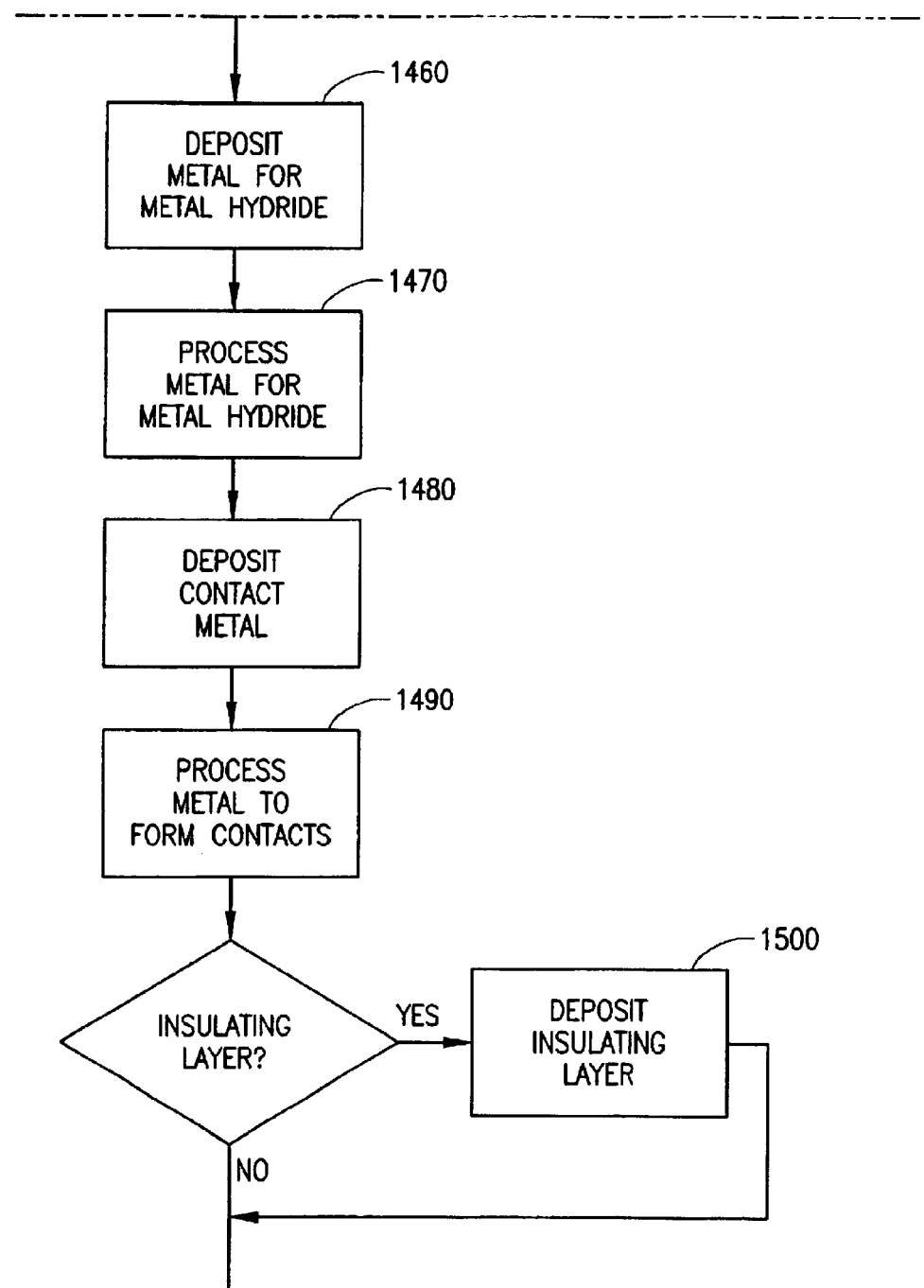

FIGS. 16A–F illustrate another embodiment of the fabrication of the structure depicted in FIGS. 5 and 6. FIGS. 17A–C are a flow diagram of the fabrication sequence 1400 corresponding to FIGS. 16A–F. In this embodiment, the sequence of steps employed is different from that associated with the embodiment depicted in FIGS. 10A–C, but the resulting structure 700 is analogous to chip 200. According to this optional embodiment, the layer of hydride-forming metal is deposited and processed before the deposition of the layer of electrical contact metal. Use of this optional fabrication sequence might be dictated by either a materials of construction consideration (e.g., the metal employed for the electrical contacts) or by the etching process that is employed.

According to this embodiment, after preparing a substrate 710 (FIG. 16A) (step 1410), a layer of polycrystalline silicon 720 (FIG. 16A) is deposited (step 1430) upon prepared substrate 710. The deposited layer of polycrystalline silicon 720 is processed (step 1450) to remove portions of the deposited layer of polycrystalline silicon 720 and form at least one or a plurality of thin film resistors (725)(FIG. 16B). A layer of hydride-forming metal 730 (FIG. 16C) is deposited upon an area where the polycrystalline silicon has been removed and upon the at least one or a plurality of thin film resistors 725 (step 1460). The layer of hydride-forming metal 730 is processed to remove portions of the deposited layer of hydride-forming metal 730 and form at least one or a plurality of thin film layers of hydride-forming metal 735

(FIG. 16D)(step 1470). A layer of electrical contact metal 740 (FIG. 16E) is deposited upon an area where the hydride-forming metal has been removed, and upon the at least one or a plurality of thin film layers of hydride-forming metal 735 (step 1480). The deposited layer of electrical contact metal 740 is processed to remove portions of the deposited layer of electrical contact metal 740 and form electrical contacts 745 (FIG. 16F)(step 1490). The at least one or a plurality of thin film layers of hydride-forming metal 735 are then charged with hydrogen (step 1510) to form at least one or a plurality of thin film layers of metal hydride so as to provide a hydrogen-charged package. The hydrogen-charged package is then enclosed.

Optional embodiments of the method of fabrication depicted in FIGS. 17A–C include, for example, the following. If substrate 710 is silicon, the method can further comprise oxidizing a surface of substrate 710 (step 1420). If polycrystalline silicon 720 has not been doped prior to deposition, the method can further comprise implanting the deposited polycrystalline silicon (step 1440).

If desired, the method can further comprise, before the step 1510 of charging the at least one or a plurality of thin film layers of hydride-forming metal with hydrogen, depositing upon the at least one or a plurality of thin film layers of hydride-forming metal 735 (FIG. 16D), and upon the electrical contacts 745 (FIG. 16F), an insulating layer 547 (FIG. 9B)(step 1500).

In still another optional embodiment, the method can further comprise, before the step 1540 of enclosing the package, depositing (step 1520) and processing (step 1530) at least one or a plurality of low-temperature deposition layers 355 (FIG. 8B), wherein the at least one or a plurality of thin film layers of metal hydride 735 (FIG. 16D) remain uncovered by the at least one or a plurality of low-temperature deposition layers 355.

After the chip or package is enclosed, the heater or heaters can be activated as described above so as to release the hydrogen from the metal hydride. The small thermal mass of the heater and associated metal hydride facilitate rapid cooling of the metal hydride film once the heater has been turned off so that only an insignificant amount of hydrogen might be re-absorbed.

Figure 13A:
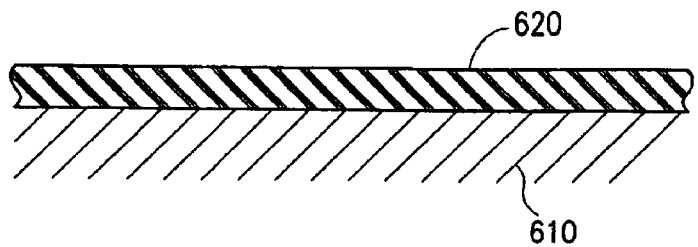
FIGS. 13A–D illustrate the fabrication of the embodiment of the structure depicted in FIG. 12.
Figure 13B:
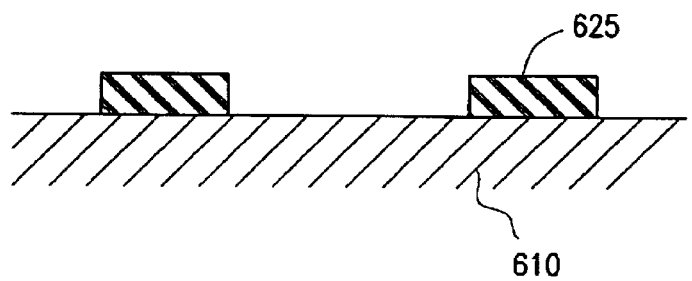
Figure 13C:
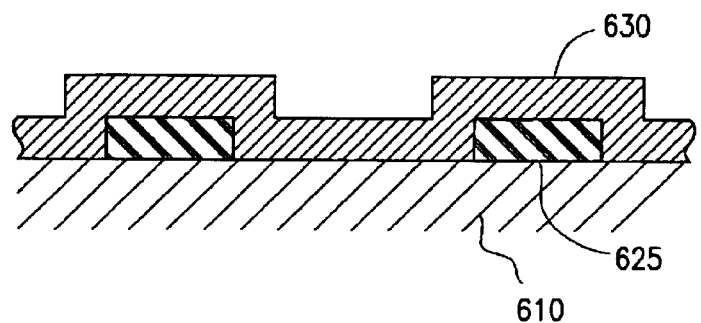
Figure 13D:
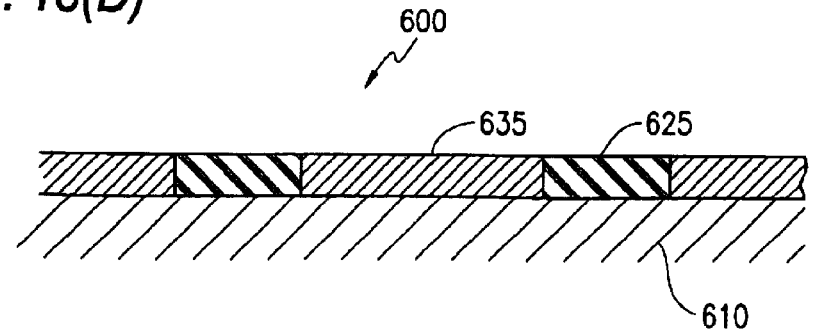
Figure 14A:
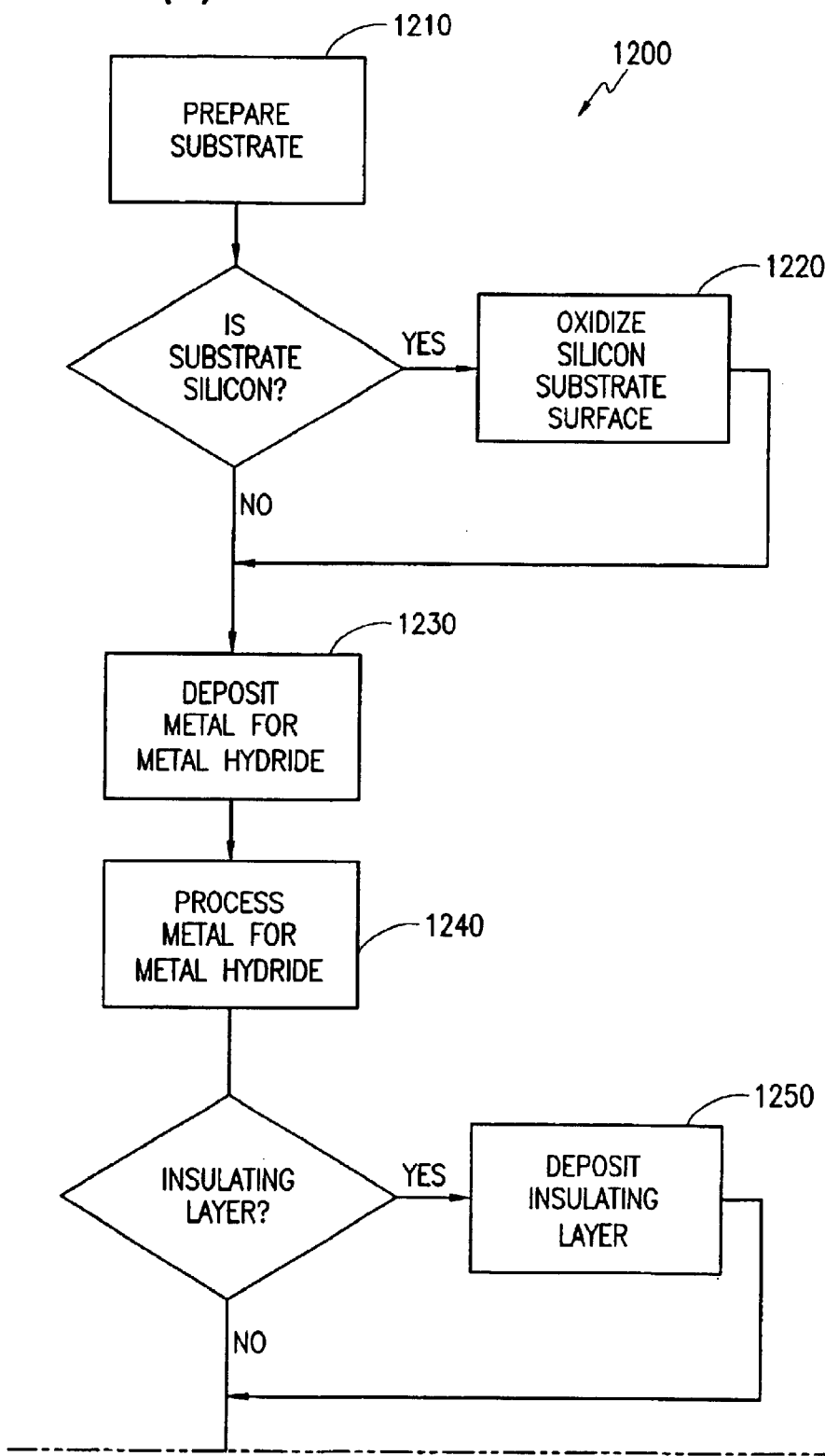
FIGS. 14A and B are a flow diagram of the fabrication sequence corresponding to FIGS. 13A–D.

FIGS. 14A and B are a flow diagram of the fabrication sequence 1200 corresponding to FIGS. 13A–D. This sequence is employed to fabricate the chip 600 for use with the external source of heat. According to this embodiment, after preparing a substrate 610 (FIG. 13A)(step 1210), a layer of hydride-forming metal 620 (FIG. 13A) is deposited upon substrate 610 (step 1230). The layer of hydride-forming metal 620 is photo-processed to form one or a plurality of thin film layers of hydride-forming metal 625 (FIG. 13B)(step 1240). The one or a plurality of thin film layers of hydride-forming metal 625 are then charged with hydrogen (step 1260) to form one or a plurality of thin film layers of metal hydride, and the charged package is enclosed.

Optional embodiments of the method of fabrication depicted in FIGS. 14A and B include, for example, the following. If substrate 610 is silicon, the method can further comprise oxidizing a surface of substrate 610 (step 1220). If desired, the method can further comprise, before the step 1260 of charging the one or a plurality of thin film layers of hydride-forming metal with hydrogen, depositing upon the one or a plurality of thin film layers of hydride-forming metal 625 (FIG. 13B), an insulating layer (step 1250).

In still another optional embodiment, the method can further comprise, before the step 1290 of enclosing the package, depositing (step 1270) and photo-processing (step 1280) one or a plurality of low-temperature deposition layers 630 (FIG. 13C), wherein the one or a plurality of thin film layers of metal hydride 625 (FIG. 12) remain uncovered by the one or a plurality of processed low-temperature deposition layers 635 (FIG. 13D).

Figure 15:
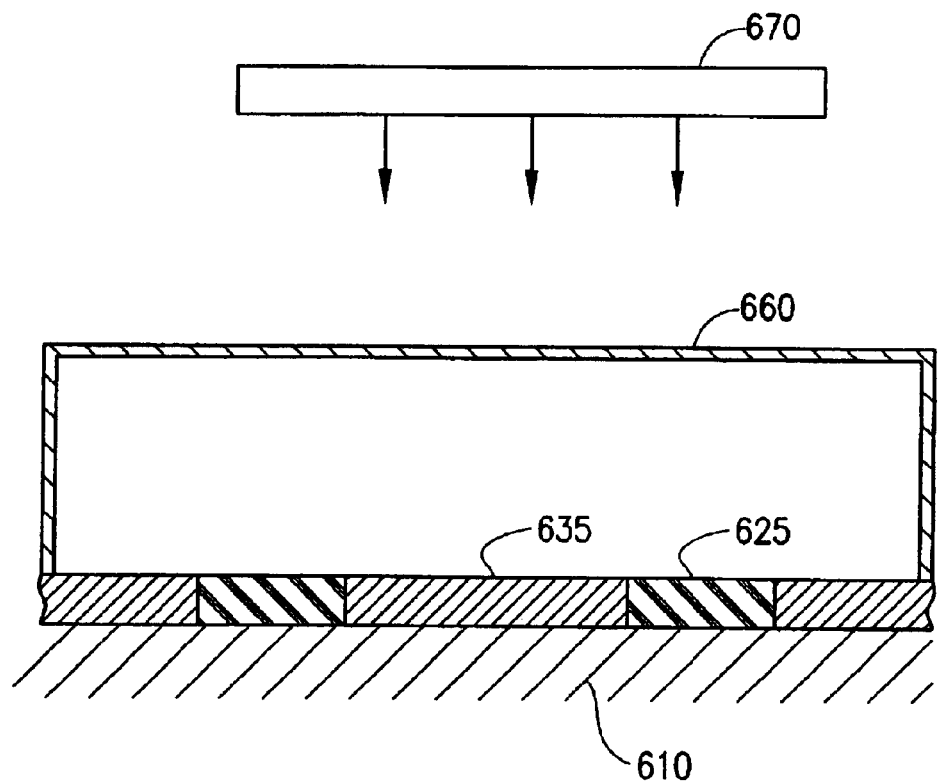
FIG. 15 is a schematic view of a method of heating with an external source of heat a package containing the chip depicted in FIG. 12.

FIG. 15 is a schematic view of the method of heating with an external source of heat 670 a package containing the chip 600 depicted in FIG. 12. As explained above, the source of heat can be laser radiation or a similar intense energy source that is communicated to chip 600 through a "window" in the package. The external heating method can be desirable, for example, when enclosure 660 is a transparent cover plate.

The various embodiments of the heat conductive packaging described herein are particularly useful in a memory device and in a processor-based system that employs the memory device.

Figure 22:
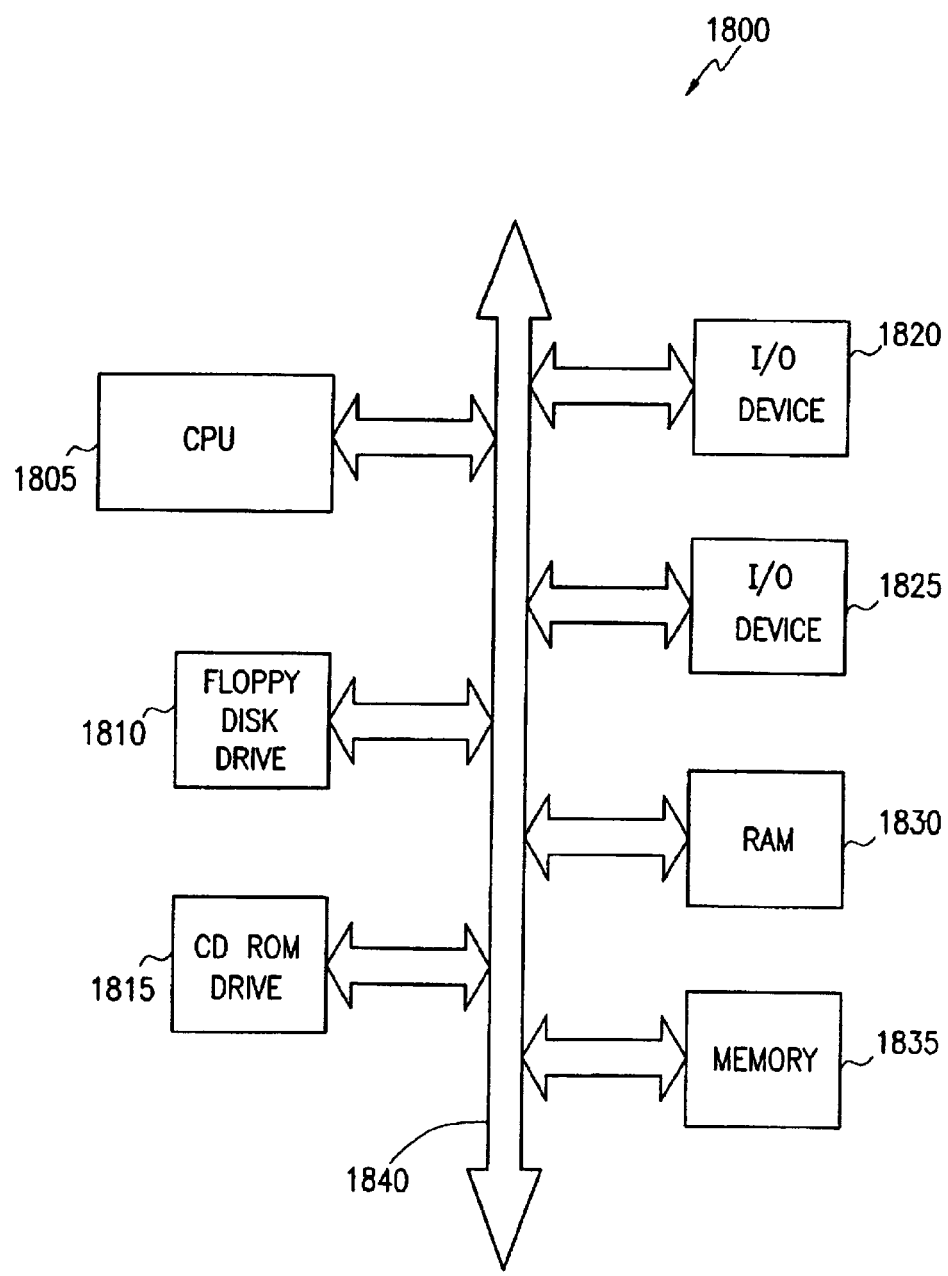
FIG. 22 is a block diagram of a processor-based system utilizing a memory device which includes heat conductive packaging constructed in accordance with the present invention.

FIG. 22 is a block diagram of a processor-based system 1800 utilizing a memory device 1835 comprising heat conductive semiconductor packaging constructed in accordance with the present invention. The processor-based system 1800 may be a computer system, a process control system or any other system employing a processor and associated memory. The system 1800 includes a central processing unit (CPU) 1805, e.g., a microprocessor, that communicates with the memory device 1835 and an I/O device 1820 over a bus 1840. Bus 1840 may be a series of buses and bridges commonly used in a processor-based system, but for convenience purposes only, the bus 1840 has been illustrated as a single bus. A second I/O device 1825 is illustrated, but is not necessary to practice the invention. The processor-based system 1800 also includes random access memory (RAM) device 1830 and may include a read-only memory (ROM) device (not shown), and peripheral devices such as a floppy disk drive 1810 and a compact disk (CD) ROM drive 1815 that also communicate with the CPU 1805 over the bus 1840 as is well known in the art. The central processing unit 1805, and other illustrated electrical components, may also employ the heat conductive semiconductor packaging constructed in accordance with the claimed invention.

The present invention, therefore, provides heat conductive packaging of air-bridge and other low dielectric constant semiconductor chips. By virtue of the features described herein) the invention provides methods and structures which overcome the deficiencies associated with various prior art approaches. The invention's use of elevated pressure is particularly beneficial, since the thermal conductivities of hydrogen and helium increase approximately linearly with their pressure.

Although the invention has been exemplified as being suitable for use in the aforementioned semiconductor applications, one skilled in the art can appreciate that the invention could be employed in other services in which enhanced heat removal capability is desired.

While only certain preferred embodiments of this invention have been shown and described by way of illustration, modifications may occur to those skilled in the art and it is, therefore, desired that it be understood that it is intended herein to cover all such modifications that fall within the true spirit and scope of this invention.

For example, while the metal hydride has been exemplified herein as titanium hydride, the hydride can be any other metal hydride that is capable of both accommodating the charged hydrogen and providing the desired level of heat transfer capability.

By way of further example of modifications within the scope of this invention, in one embodiment, the method of heating the metal hydride has been described as using an internal source of heat (i.e., the underlying heater). In another embodiment, the method of heating has been described as using an external source of heat (e.g., a laser). Depending upon the particular service requirements, however, another possible embodiment might include a combination of internal and external sources of heating. Still another embodiment might include not only a combination of internal and external sources of heating, but a combination of island-type and hydrogen release-dedicated chips.

Accordingly, the above description and accompanying drawings are only illustrative of preferred embodiments that can achieve the features and advantages of the present invention. It is not intended that the invention be limited to the embodiments shown and described in detail herein. The invention is limited only by the scope of the following claims.

What is claimed as new and desired to be protected by Letters Patent of the United States is:

1. A method of providing a semiconductor package, said method comprising the steps of:
   hermetically sealing a semiconductor chip within a package, said package enclosing a first gas comprising helium at a first pressure and a heat-activated source of releasable hydrogen: and
   pressurizing said hermetically sealed package from said first pressure to a second pressure by applying heat to said heat-activated source of releasable hydrogen, thereby releasing said hydrogen into said first gas, so as to provide a second pressure gas having an increased hydrogen content.

2. A method according to claim 1, wherein said second pressure gas comprises from about 3% to about 12% hydrogen.

3. A method according to claim 1, wherein said second pressure gas comprises from about 5% to about 10% hydrogen.

4. A method according to claim 1, wherein said second pressure is from about 5 MPa to about 50 MPa.

5. A method according to claim 1, wherein said first gas further comprises hydrogen.

6. A method according to claim 5, wherein said first gas comprises from about 3% to about 12% hydrogen.

7. A method according to claim 6, wherein said mixture comprises about 5% hydrogen.

8. A method according to claim 1, wherein said source of releasable hydrogen is a metal hydride.

9. A method according to claim 8, wherein said metal hydride is formed as a thin film metal hydride.

10. A method according to claim 8, wherein said metal hydride is titanium hydride.

11. A method according to claim 1, wherein said step of heating the source of releasable hydrogen comprises using at least one heat source.

12. A method according to claim 1, wherein said step of heating the source of releasable hydrogen comprises using a plurality of heat sources.

13. A method according to claim 1, wherein said source of releasable hydrogen is at least one integrated circuit-bearing chip, said chip comprising at least one surface location of a layer of metal hydride.

14. A method according to claim 13, said at least one chip comprising a plurality of surface locations of a layer of metal hydride.

15. A method according to claim 13, wherein said step of heating the source of releasable hydrogen comprises using a heater and heater circuitry associated with the at least one integrated circuit-bearing chip.

16. A method according to claim 1, wherein said source of releasable hydrogen is a plurality of integrated circuit-bearing chips, each of said plurality of chips comprising at least one surface location of a layer of metal hydride.

17. A method according to claim 16, each of said plurality of chips comprising a plurality of surface locations of a layer of metal hydride.

18. A method according to claim 16, wherein said step of heating the source of releasable hydrogen comprises using a heater and heater circuitry associated with each of the plurality of integrated circuit-bearing chips.

19. A method according to claim 1, wherein said source of releasable hydrogen is at least one non-integrated circuit-bearing chip, said chip comprising a surface layer of metal hydride.

20. A method according to claim 19, wherein said step of heating the source of releasable hydrogen comprises using a heater and heater circuitry associated with the at least one non-integrated circuit-bearing chip.

21. A method according to claim 1, wherein said source of releasable hydrogen is a plurality of non-integrated circuit-bearing chips, each of said plurality of chips comprising a surface layer of metal hydride.

22. A method according to claim 21, wherein said step of heating the source of releasable hydrogen comprises using a heater and heater circuitry associated with each of the plurality of non-integrated circuit-bearing chips.

23. A method according to claim 1, wherein said source of releasable hydrogen comprises:
   at least one integrated circuit-bearing chip, said at least one chip comprising at least one surface location of a layer of metal hydride, and
   at least one non-integrated circuit-bearing chip, said at least one chip comprising a surface layer of hydride.

24. A method according to claim 23, said at least one integrated circuit-bearing chip comprising a plurality of surface locations of a layer of metal hydride.

25. A method according to claim 23, wherein said step of heating the source of releasable hydrogen comprises using a heater and heater circuitry associated with each of the at least one integrated circuit-bearing chip and the at least one non-integrated circuit-bearing chip.

26. A method according to claim 1, wherein said source of releasable hydrogen comprises:
   a plurality of integrated circuit-bearing chips, each of said plurality of chips comprising at least one surface location of a layer of metal hydride, and
   a plurality of non-integrated circuit-bearing chip, each of said plurality of chips comprising a surface layer of metal hydride.

27. A method according to claim 26, each of said plurality of integrated circuit-bearing chips comprising a plurality of surface locations of a layer of metal hydride.

28. A method according to claim 26, wherein said step of heating the source of releasable hydrogen comprises using a heater and heater circuitry associated with each of the plurality of integrated circuit-bearing chips and the plurality of non-integrated circuit-bearing chips.

29. A method of providing a semiconductor package, said method comprising the steps of:
   hermetically sealing a semiconductor chip within a package, said package enclosing a first gas at a first pressure and a heat-activated source of releasable hydrogen;

pressurizing said hermetically sealed package from said first pressure to a second pressure by applying heat from a source of heat external to said package to said heat-activated source of releasable hydrogen, thereby releasing said hydrogen into said first gas, so as to provide a second pressure gas having an increased hydrogen content; and cooling said heat-activated source of releasable hydrogen at a rate sufficient to minimize the re-absorption of hydrogen by said source.

30. A method of providing a semiconductor package, said method comprising the steps of:

hermetically sealing a semiconductor chip within a package, said package enclosing a first gas at a first pressure and a heat-activated source of releasable hydrogen; and pressurizing said hermetically sealed package from said first pressure to a second pressure by applying heat from a source of heat external to said package to said heat-activated source of releasable hydrogen, thereby releasing said hydrogen into said first gas, so as to provide a second pressure gas having an increased hydrogen content.

31. A method according to claim 30, wherein said step of heating is effected with a laser.

32. A method according to claim 31, wherein said step of heating is effected with an eximer laser.

33. A method of fabricating semiconductor package, said method comprising the steps of:

depositing on a substrate a layer of silicon;

patterning said deposited layer of silicon to form at least one thin film heat source;

depositing upon said patterned layer a layer of hydride-forming metal;

patterning said layer of hydride-forming metal so as to correspond with the patterned layer of the at least one heat source; and charging said patterned layer of hydride-forming metal with hydrogen so as to provide a patterned layer of metal hydride.

34. A method of fabricating a semiconductor package, said method comprising the steps of:

depositing on a substrate a layer of doped polycrystalline silicon;

patterning said deposited layer of doped polycrystalline silicon to form one or a plurality of thin film resistors capable of serving as heating elements when connected electrically to an external power source;

depositing upon said patterned layer an insulating layer to chemically protect and electrically isolate the one or a plurality of resistors;

depositing upon said insulating layer a layer of hydride-forming metal;

patterning said layer of hydride-forming metal so as to correspond with the patterned layer of the one or a plurality of thin film resistors; and charging said patterned layer of hydride-forming metal with hydrogen so as to provide a patterned layer of metal hydride.

35. A method of fabricating according to claim 34, wherein said substrate is silicon, said method further comprising oxidizing the silicon substrate before said step of depositing the layer of doped polycrystalline silicon.

36. A method of fabricating according to claim 34, wherein said hydride-forming metal is selected from the group consisting of titanium, zirconium, chromium, vanadium, and tantalum.

37. A method of fabricating according to claim 34, wherein said hydride-forming metal is titanium.

38. A method of fabricating according to claim 34, wherein said step of charging the patterned layer of hydride-forming metal with hydrogen comprises heating the layer of hydride-forming metal under an external hydrogen pressure for a period of time sufficient to convert the hydride-forming metal to the metal hydride.

39. A method of fabricating according to claim 38, wherein said hydride-forming metal is heated to a temperature of from approximately 500° C. to approximately 600° C.

40. A method of fabricating according to claim 34, wherein said external hydrogen pressure is from approximately 1 atm to approximately 5 atm.

41. A method of fabricating according to claim 34, wherein said layer of hydride-forming metal is deposited so as to have a thickness of from approximately less than 1 micron to several microns.

42. A method of fabricating according to claim 34, comprising providing feedback circuitry capable of activating said patterned layer of metal hydride upon demand so as to maintain a desired hydrogen pressure within the semiconductor package.

43. A method of fabricating a semiconductor package, said method comprising the steps of:

depositing on a substrate a layer of doped polycrystalline silicon, said deposition occurring at a first temperature;

patterning said deposited layer of doped polycrystalline silicon to form one or a plurality of thin film resistors capable of serving as heating elements when connected electrically to an external power source;

depositing upon said patterned layer an insulating layer to chemically protect and electrically isolate the one or a plurality of resistors;

depositing upon said insulating layer a layer of hydride-forming metal;

patterning said layer of hydride-forming metal so as to correspond with the patterned layer of the one or a plurality of thin film resistors;

charging said patterned layer of hydride-forming metal with hydrogen so as to provide a patterned layer of metal hydride, said step of charging occurring at a second temperature less than or equal to said first temperature; and depositing one or a plurality of subsequent low-temperature depositions, wherein said patterned layer of metal hydride remains uncovered by the subsequent low-temperature depositions.

44. A method of fabricating a semiconductor package, said method comprising the steps of:

depositing upon a prepared substrate a layer of polycrystalline silicon;

processing said deposited layer of polycrystalline silicon to remove portions of the deposited layer of polycrystalline silicon and form at least one thin film resistor;

depositing upon an area where said polycrystalline silicon has been removed, and upon said at least one thin film resistor, a layer of electrical contact metal;

processing said deposited layer of electrical contact metal to remove portions of the deposited layer of electrical contact metal and form electrical contacts;

depositing upon said at least one thin film resistor, and upon said electrical contacts, a layer of hydride-forming metal;

processing said layer of hydride-forming metal to remove portions of the deposited layer of hydride-forming metal and form at least one thin film layer of hydride-forming metal;

charging said at least one thin film layer of hydride-forming metal with hydrogen to form at least one thin film layer of metal hydride so as to provide a hydrogen-charged package; and enclosing said hydrogen-charged package.

45. A method of fabricating according to claim 44, wherein said substrate is silicon.

46. A method of fabricating according to claim 44, further comprising oxidizing a surface of said silicon substrate.

47. A method of fabricating according to claim 44, wherein said polycrystalline silicon is doped polycrystalline silicon.

48. A method of fabricating according to claim 44, further comprising implanting said deposited polycrystalline silicon.

49. A method of fabricating according to claim 44, further comprising, before said step of depositing the layer of metal for metal hydride, depositing upon the at least one thin film resistor, and upon the electrical contacts, an insulating layer.

50. A method of fabricating according to claim 49, wherein said insulating layer is $SiO_2$.

51. A method of fabricating according to claim 44, further comprising, before said step of charging the at least one thin film layer of hydride-forming metal with hydrogen, depositing upon the at least one thin film layer of hydride-forming metal, and upon the electrical contacts, an insulating layer.

52. A method of fabricating according to claim 44, further comprising, before said step of enclosing the package, depositing and processing at least one low-temperature deposition layer, wherein said at least one thin film layer of metal hydride remains uncovered by the at least one low-temperature deposition layer.

53. A method of fabricating according to claim 44, wherein said step of processing the deposited layer of polycrystalline silicon to remove portions of the deposited layer of polycrystalline silicon comprises forming a plurality of thin film resistors.

54. A method of fabricating according to claim 53, wherein said step of depositing the layer of electrical contact metal comprises depositing upon an area where said polycrystalline silicon has been removed, and upon said plurality of thin film resistors.

55. A method of fabricating according to claim 53, wherein said step of depositing the layer of hydride-forming metal comprises depositing upon said plurality of thin film resistors, and upon said electrical contacts.

56. A method of fabricating according to claim 55, wherein said step of processing the layer of hydride-forming metal to remove portions of the deposited layer of hydride-forming metal comprises forming a plurality of thin film layers of hydride-forming metal.

57. A method of fabricating according to claim 56, wherein said step of charging the plurality of thin film layers of hydride-forming metal with hydrogen comprises forming a plurality of thin film layers of metal hydride.

58. A method of fabricating according to claim 44, further comprising, before said step of depositing the layer of metal for metal hydride, depositing upon the plurality of thin film resistors, and upon the electrical contacts, an insulating layer.

59. A method of fabricating according to claim 44, further comprising, before said step of charging the plurality of thin film layers of hydride-forming metal with hydrogen, depositing upon the plurality of thin film layers of hydride-forming metal, and upon the electrical contacts, an insulating layer.

60. A method of fabricating according to claim 44, further comprising, before said step of enclosing the package, depositing and processing a plurality of low-temperature deposition layers, wherein said plurality of thin film layers of metal hydride remain uncovered by the plurality of low-temperature deposition layers.

61. A method of fabricating a semiconductor package, said method comprising the steps of:

depositing upon a prepared substrate a layer of hydride-forming metal;

processing said layer of hydride-forming metal to remove portions of the deposited layer of hydride-forming metal and form one or a plurality of thin film layers of hydride-forming metal;

charging said one or a plurality of thin film layers of hydride-forming metal with hydrogen to form one or a plurality of thin film layers of metal hydride so as to provide a hydrogen-charged package; and enclosing said hydrogen-charged package.

62. A method of fabricating according to claim 61, wherein said substrate is silicon.

63. A method of fabricating according to claim 62, further comprising oxidizing a surface of said silicon substrate.

64. A method of fabricating according to claim 61, further comprising, before said step of charging the one or a plurality of thin film layers of hydride-forming metal with hydrogen, depositing upon the one or a plurality of thin film layers of hydride-forming metal, an insulating layer.

65. A method of fabricating according to claim 64, wherein said insulating layer is $SiO_2$.

66. A method of fabricating according to claim 61, further comprising, before said step of enclosing the package, depositing and processing one or a plurality of low-temperature deposition layers, wherein said one or a plurality of thin film layers of metal hydride remain uncovered by the one or a plurality of low-temperature deposition layers.

67. A method of fabricating a semiconductor package, said method comprising the steps of:

depositing upon a prepared substrate a layer of polycrystalline silicon;

processing said deposited layer of polycrystalline silicon to remove portions of the deposited layer of polycrystalline silicon and form one or a plurality of thin film resistors;

depositing upon an area where said polycrystalline silicon has been removed, and upon said one or a plurality of thin film resistors, a layer of hydride-forming metal;

processing said layer of hydride-forming metal to remove portions of the deposited layer of hydride-forming metal and form one or a plurality of thin film layers of hydride-forming metal;

depositing upon an area where said hydride-forming metal has been removed, and upon said one or a plurality of thin film layers of hydride-forming metal, a layer of electrical contact metal;

processing said deposited layer of electrical contact metal to remove portions of the deposited layer of electrical contact metal and form electrical contacts;

charging said one or a plurality of thin film layers of hydride-forming metal with hydrogen to form one or a plurality of thin film layers of metal hydride so as to provide a hydrogen-charged package; and enclosing said hydrogen-charged package.

* * * * *

UNITED STATES PATENT AND TRADEMARK OFFICE
CERTIFICATE OF CORRECTION

| | | |
|---|---|---|
| PATENT NO. | : 6,953,706 B2 | Page 1 of 2 |
| DATED | : October 11, 2005 | |
| INVENTOR(S) | : Jerome Eldridge et al. | |

It is certified that error appears in the above-identified patent and that said Letters Patent is hereby corrected as shown below:

Column 8,
Line 9, after "thus" insert the following:

-- enabling a more rapid cooling of the metal islands upon termination of the heating cycle. If a laser is employed, it is typically an eximer laser. The external heating method can be desirable, for example, when using a transparent cover plate on the semiconductor package (see FIG. 15).

Depending upon the particular application, the external heating embodiment may have at least two potential advantages over the internal heating embodiment. The first is the elimination of the requirement for the on-chip heaters, thus potentially saving both chip area and additional fabrication processing steps. The second advantage is that elimination of the heaters will facilitate a more rapid cooling of the metal hydride upon the termination of the heating cycle, because the thermal mass of the heaters has been eliminated.

According to one possible embodiment of the metal hydride-containing structure, the metal hydride is contained in a single chip. In another possible embodiment of the metal hydride-containing structure, the metal hydride is contained in a plurality of chips, i.e., within a package housing the plurality of chips.

Furthermore, as described in more detail below, various configurations of the metal hydride thin films within the chips and/or the package are possible. The configuration of the metal hydride can include, in a first embodiment, where needed to generate the pressure required in larger semiconductor packages, a relatively large area of metal hydride material on at least one or a plurality of hydrogen generation-dedicated chips. In a second embodiment, the configuration of the metal hydride can include at least--

Line 37, after "chip 200.)", delete lines 37 to 67.

Column 18,
Line 51, "circuit-bearing chip" should read -- circuit-bearing chips --.

Column 19,
Line 28, "fabricating semiconductor" should read -- fabricating a semiconductor --.

UNITED STATES PATENT AND TRADEMARK OFFICE
CERTIFICATE OF CORRECTION

PATENT NO. : 6,953,706 B2
DATED : October 11, 2005
INVENTOR(S) : Jerome Eldridge et al.

It is certified that error appears in the above-identified patent and that said Letters Patent is hereby corrected as shown below:

<u>Column 20,</u>
Lines 21-22, "claim 34, comprising" should read -- claim 34, further comprising --.

Signed and Sealed this

Twenty-eighth Day of February, 2006

JON W. DUDAS
*Director of the United States Patent and Trademark Office*